United States Patent
Park

(10) Patent No.: US 9,318,369 B2
(45) Date of Patent: Apr. 19, 2016

(54) PATTERNS OF A SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventor: Je-Min Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/175,257

(22) Filed: Feb. 7, 2014

(65) Prior Publication Data

US 2014/0312455 A1 Oct. 23, 2014

(30) Foreign Application Priority Data

Apr. 19, 2013 (KR) .................. 10-2013-0043412

(51) Int. Cl.
| | |
|---|---|
| *H01L 29/00* | (2006.01) |
| *H01L 21/762* | (2006.01) |
| *H01L 21/76* | (2006.01) |
| *H01L 27/108* | (2006.01) |

(52) U.S. Cl.
CPC .......... *H01L 21/76229* (2013.01); *H01L 21/76* (2013.01); *H01L 27/10876* (2013.01); *H01L 27/10894* (2013.01)

(58) Field of Classification Search
CPC . H01L 27/108; H01L 27/10876; H01L 27/10; H01L 21/76; H01L 21/762; H01L 21/76229
USPC ........................... 257/395–397, 401, 506, 510
See application file for complete search history.

(56) References Cited

U.S. PATENT DOCUMENTS

| | | | | |
|---|---|---|---|---|
| 2008/0045019 | A1* | 2/2008 | Kim et al. ...................... | 438/693 |
| 2008/0048293 | A1* | 2/2008 | Horii .............................. | 257/536 |
| 2012/0091554 | A1 | 4/2012 | Lee | |
| 2012/0104511 | A1 | 5/2012 | Chan et al. | |
| 2012/0202336 | A1 | 8/2012 | Park et al. | |
| 2014/0103482 | A1* | 4/2014 | Kim et al. ..................... | 257/499 |

FOREIGN PATENT DOCUMENTS

| | | |
|---|---|---|
| KR | 2004-0000758 A | 1/2004 |
| KR | 10-0983509 B1 | 9/2010 |
| KR | 2012-0004802 A | 1/2012 |
| KR | 2012-0041989 A | 5/2012 |

\* cited by examiner

*Primary Examiner* — Matthew E Warren
(74) *Attorney, Agent, or Firm* — Harness, Dickey & Pierce, P.L.C.

(57) ABSTRACT

A semiconductor device including a plurality of active patterns, a plurality of first isolation layer patterns and a plurality of second isolation layer patterns may be provided. In particular, the active patterns may be arranged both in a first direction and in a second direction, and may protrude from a substrate and have a length in the first direction. The first isolation layer patterns may fill a first space, the first space provided between the active patterns and arranged in the first direction, and support two opposing sidewalls of neighboring active patterns. The second isolation layer patterns may fill a second space between the active patterns and the first isolation layer patterns. Accordingly, the active patterns of the semiconductor device may not collapse or incline because the first isolation layer patterns support the active patterns.

20 Claims, 23 Drawing Sheets

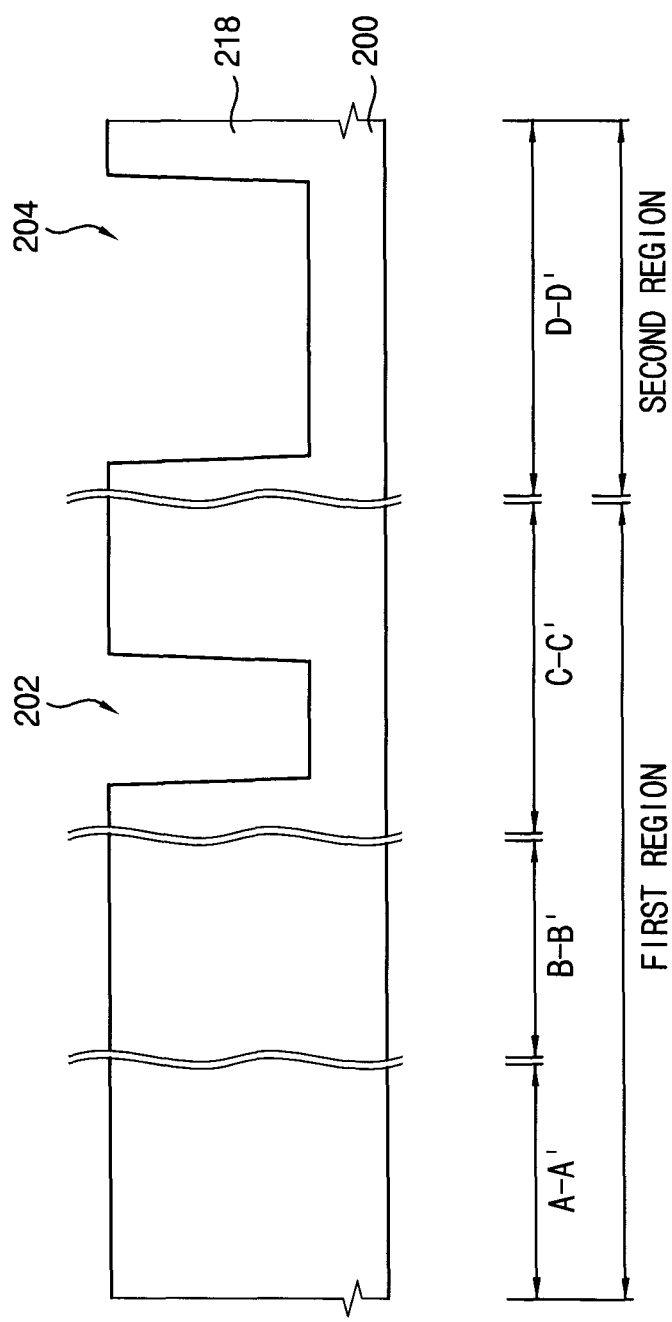

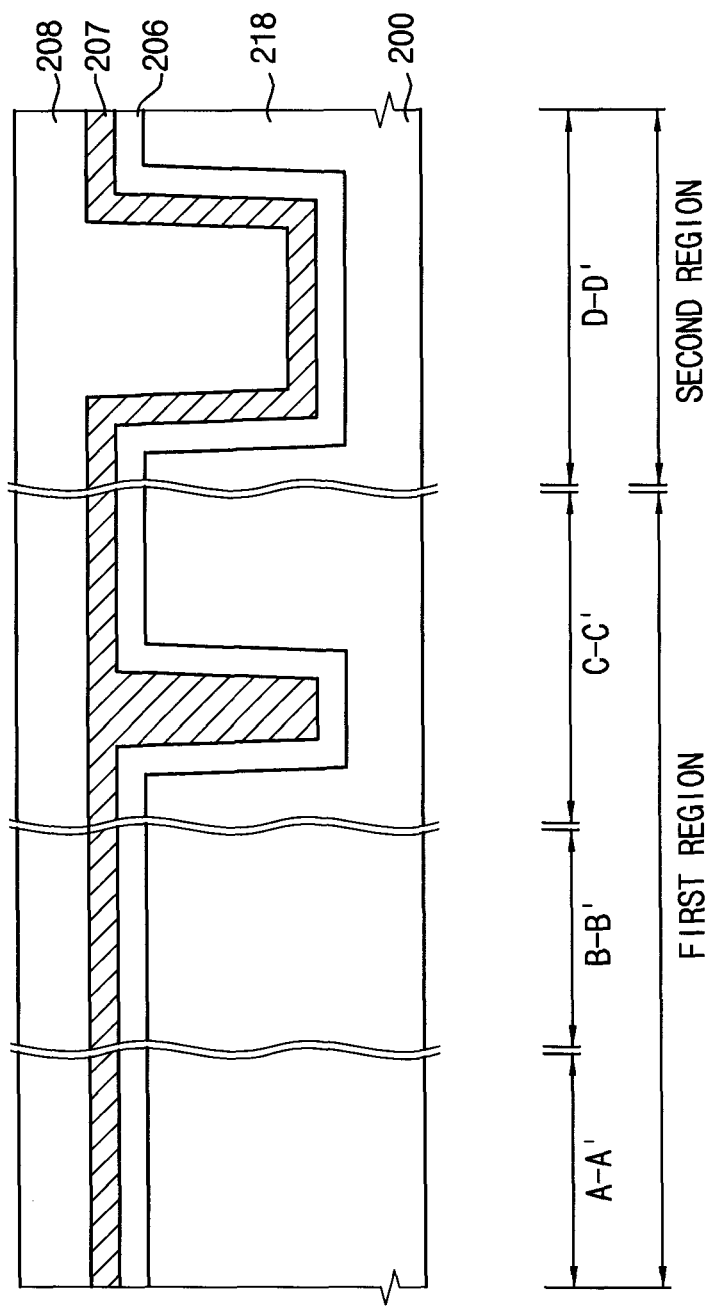

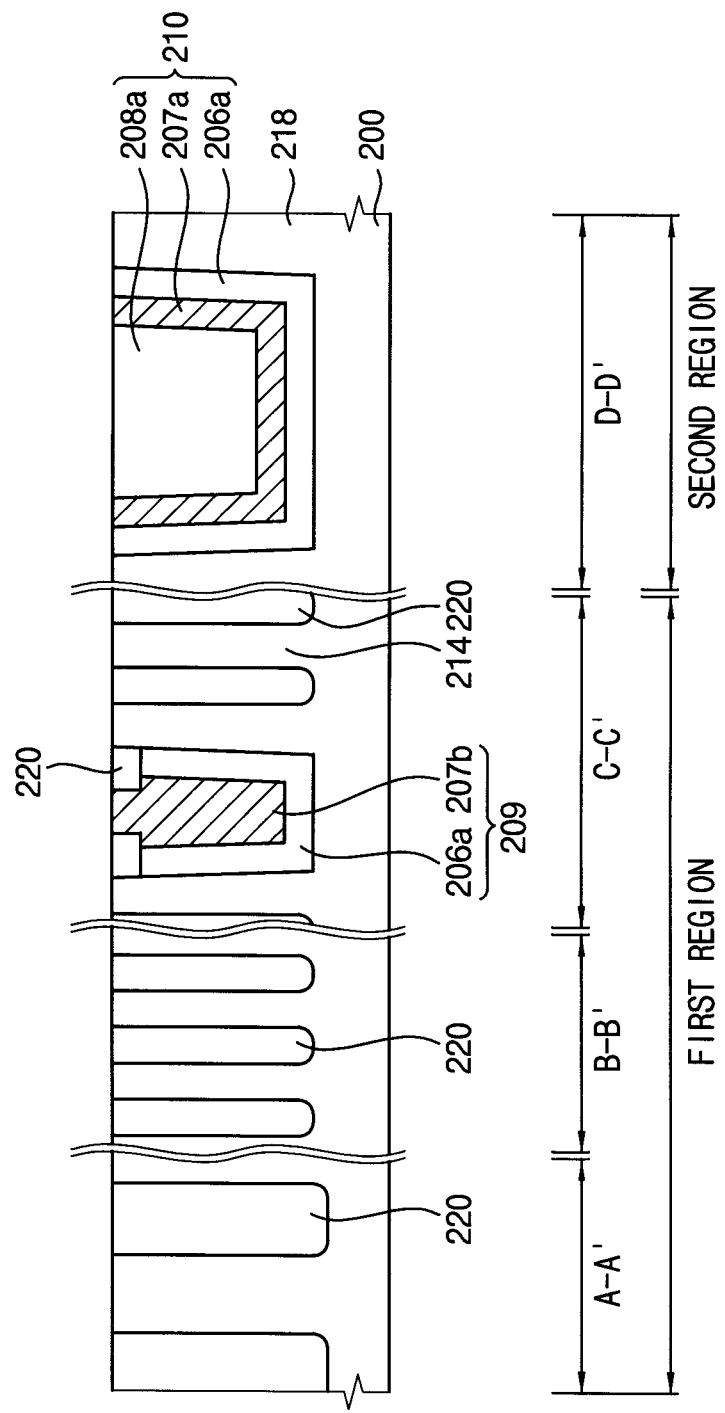

FIRST
DIRECTION
FOURTH
DIRECTION

FIRST
DIRECTION
FOURTH
DIRECTION

PATTERNS OF A SEMICONDUCTOR DEVICE AND METHOD OF MANUFACTURING THE SAME

CROSS-REFERENCE TO RELATED APPLICATION

This application claims priority under 35 USC §119 to Korean Patent Application No. 10-2013-0043412 filed on Apr. 19, 2013 in the Korean Intellectual Property Office (KIPO), the contents of which are herein incorporated by reference in their entirety.

BACKGROUND

1. Field

Example embodiments relate to patterns of a semiconductor device and/or methods of manufacturing the same. More particularly, example embodiments relate to patterns of semiconductor devices including an active region and an isolation region, and/or methods of manufacturing the same.

2. Description of the Related Art

As semiconductor devices, e.g., DRAM devices, become more highly integrated, a width of active regions and a space therebetween in the semiconductor device have been reduced. Therefore, for example, patterns serving as an active region may collapse or incline. Accordingly, forming patterns of a semiconductor device including active regions having a relatively narrow width and pitch is being researched.

SUMMARY

At least one example embodiment provides a pattern of a semiconductor device having a relatively narrow width and pitch.

At least one example embodiment provides a method of forming the pattern of the semiconductor device.

According to an example embodiment, a semiconductor device includes a plurality of active patterns, a plurality of first isolation layer patterns, and a plurality of second isolation layer patterns. The active patterns may be arranged both in a first direction and in a second direction, and may protrude from a substrate and have a length in the first direction. The first isolation layer patterns may fill first spaces, the first spaces between the active patterns and arranged in the first direction, the first isolation layer patterns supporting two opposing sidewalls of neighboring active patterns in the first isolation layer patterns. The second isolation layer patterns may fill second spaces between the active patterns and the first isolation layer patterns.

In an example embodiment, the first and second isolation layer patterns may be formed to have an interface therebetween.

In an example embodiment, each of the first isolation layer patterns may extend from corresponding one of the first spaces in a third direction, the third direction being perpendicular to the second direction In an example embodiment, a lower portion of each first isolation layer pattern may be wider than an upper portion thereof.

In an example embodiment, the first isolation layer patterns each may have an island-type shape from each other.

In an example embodiment, the plurality of first isolation layer patterns is in direct contact with the active patterns.

In an example embodiment, each of the first isolation layer patterns may have a linear shape extending in a third direction, the third direction being perpendicular to the second direction.

In an example embodiment, each of the first isolation layer patterns may have a plurality of bumps in a fourth direction, the fourth direction being perpendicular to the first direction.

In an example embodiment, the first and second isolation layer patterns may include an insulating material.

In an example embodiment, the semiconductor device may further include a plurality of second active patterns and a plurality of third isolation layer patterns. Each of the second active pattern may be wider than each of the first active patterns may be formed, and the second active patterns may protrude from the substrate. The third isolation layer patterns may fill third spaces between the second active patterns.

In an example embodiment, the third isolation layer patterns may include an insulating material substantially the same as that of the first isolation layer patterns.

According to an example embodiment, a method of forming patterns of a semiconductor device includes partially etching a substrate to form a plurality of trenches thereon, forming a plurality of preliminary first isolation layer patterns in the trenches, partially etching the substrate and the preliminary first isolation layer patterns to form a plurality of active patterns and a plurality of first isolation layer patterns, respectively, the active patterns arranged both in a first direction and in a second direction and having a length in the first direction, and the first isolation layer patterns formed between the active patterns in the first direction and supporting the active patterns, and forming a plurality of second isolation layer patterns filling spaces between the active patterns and the first isolation layer patterns.

In an example embodiment, each of the first isolation layer patterns may be formed to extend in a third direction.

In an example embodiment, the first isolation layer patterns each are formed to have an island-type shape.

In an example embodiment, the method may further include, when the active patterns and the first isolation layer patterns are formed, forming an etch mask having a plurality of lines extending in the first direction and covering at least a portion of the preliminary first isolation layer patterns, and etching the substrate using the etch mask.

According to an example embodiment, a semiconductor device includes a plurality of active patterns, a plurality of first isolation layer patterns, and a plurality of second isolation layer patterns. The active patterns may protrude from a substrate, and each of the active patterns may extend along a first direction. The first isolation layer patterns may fill first spaces between respective neighboring active patterns and in a second direction, and may support two opposing sidewalls of the respective neighboring active patterns. The second isolation layer patterns may fill second spaces and third spaces, the second spaces between the active patterns and in the second direction, the third spaces defined by upper and lower portions of the first isolation layer patterns.

In an example embodiment, each of the second isolation layer patterns may extend along the first direction.

In an example embodiment, each of the first isolation layer patterns may extend along the second direction.

In an example embodiment, the first and second directions may be perpendicular to each other.

In an example embodiment, a lower portion of each of the first isolation layer patterns may be wider than an upper portion thereof.

BRIEF DESCRIPTION OF THE DRAWINGS

Example embodiments will be more clearly understood from the following detailed description taken in conjunction with the accompanying drawings. FIGS. 1-17 represent non-limiting, example embodiments as described herein.

FIG. 1 is a top view illustrating a pattern of a semiconductor device in accordance with an example embodiment;

FIG. 2 is a perspective view illustrating the pattern of the semiconductor device in FIG. 1;

FIG. 3 is a cross-sectional view of the pattern cut along the line III-III' in FIG. 1;

FIG. 4 is a perspective view illustrating a pattern of a semiconductor device in accordance with an example embodiment;

FIG. 7 is a perspective view illustrating the pattern in FIG. 5D;

FIG. 8 is a top view illustrating a pattern of a semiconductor device in accordance with an example embodiment;

FIG. 9 is a cross-sectional view of the pattern of the semiconductor device in FIG. 8;

FIGS. 10A to 10E are cross-sectional views illustrating a method of manufacturing the pattern of the semiconductor device in FIGS. 8 and 9;

FIG. 12 is a perspective view illustrating patterns of a semiconductor device in accordance with an example embodiment;

FIG. 13 is a top view the patterns of the semiconductor device in FIG. 12;

FIG. 14 is a top view illustrating the patterns of the semiconductor device in FIG. 12 in accordance with another example embodiment;

FIG. 16 is a perspective view illustrating a pattern of a semiconductor device in accordance with an example embodiment;

DETAILED DESCRIPTION

Figure 1:
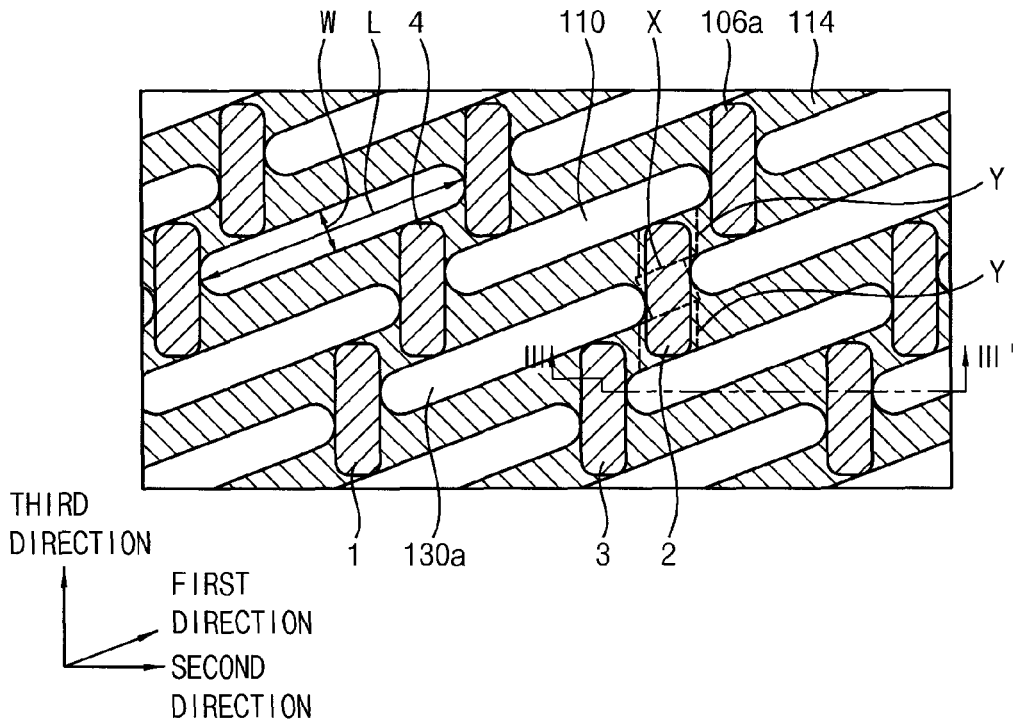

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
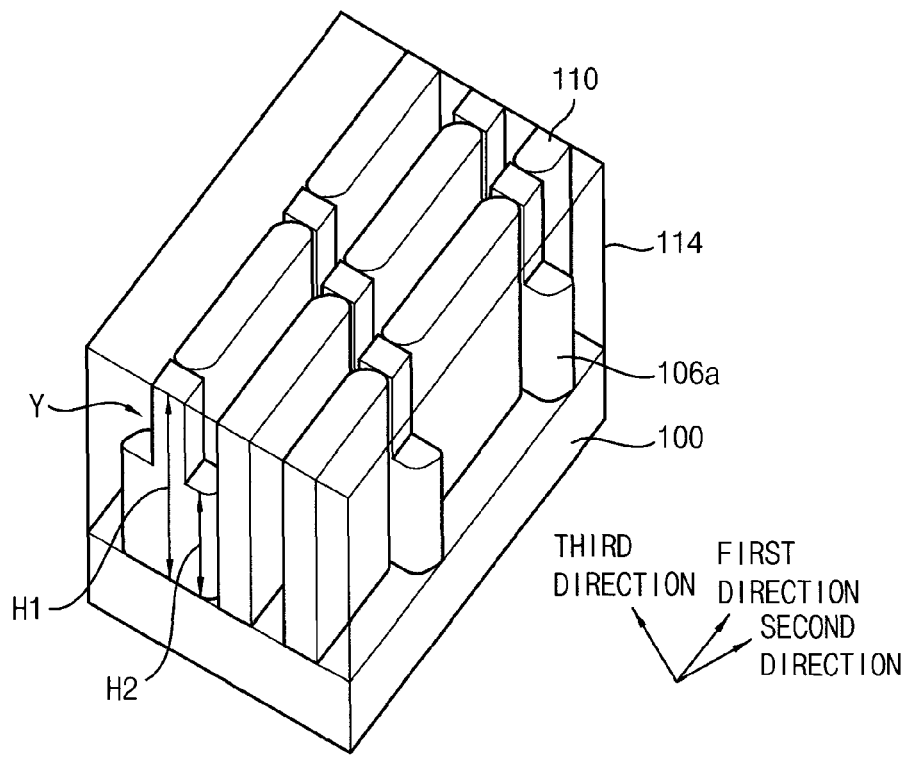
Figure 3:
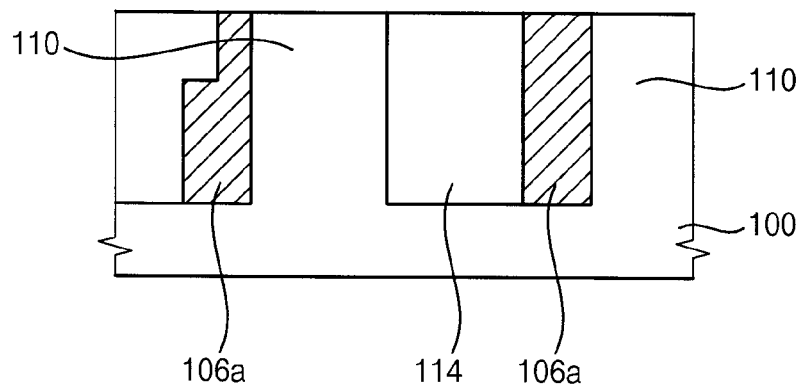

FIG. 1 is top a view illustrating a pattern of a semiconductor device in accordance with an example embodiment. FIG. 2 is a perspective view illustrating the pattern of the semiconductor device in FIG. 1. FIG. 3 is a cross-sectional view of the pattern cut along a line III-III' in FIG. 1.

In all figures in this specification, a direction in which each active region extends is referred to as a first direction, and a direction neither perpendicular to nor parallel with the first direction is referred to as a second direction. Further, a direction substantially perpendicular to the second direction is referred to as a third direction. The first direction is not perpendicular to any of the second and third directions, and has a given angle thereto.

Referring to FIGS. 1 to 3, the pattern includes a plurality of active patterns 110 protruding from a substrate 100, a plurality of first isolation layer patterns 106a, and a plurality of second isolation layer patterns 114.

The substrate 100 may include a semiconductor substrate, e.g. a silicon substrate, a germanium substrate or a silicon-germanium substrate, a silicon-on-insulator (SOI) substrate, a germanium-on-insulator (GOI) substrate, etc.

In example embodiments, the active patterns 110 may be integrally formed with the substrate 100. For example, the active patterns 110 may be formed by patterning upper portions of the initial substrate 100, and the patterned upper portions of the initial substrate 100 may be defined as the active patterns 110. The active patterns 110 may include a semiconductor material.

The active patterns 110 may serve as an active region. Each of the active patterns 110 may have a first length L along the first direction and a first width W along a direction substantially perpendicular to the first direction. The active patterns 110 may have an island-type shape from each other.

The active patterns 110 may be spaced apart from each other at a first distance in the first direction, and may be regularly arranged in the second direction.

The first isolation layer patterns 106a may be formed on the substrate 100 between the active patterns 110. Each of the first isolation layer patterns 106a may have an island-type shape from each other, and fill first region X (a space between the active patterns 110 arranged in the first direction). For example, the first isolation layer patterns 106a may directly contact sidewalls of the active patterns 110. Each of the first isolation layer patterns 106a may extend from the first region X in a given direction, e.g., in the third direction so that the first isolation layer patterns 106a may directly contact sidewalls of the active patterns 110 neighboring the first region X in the third direction.

Each first isolation layer pattern 106a may include a first portion at the first region X and second portions protruding from the first portion and extending in the third direction. A first height H1 of the first portion may be higher than a second height H2 of the second portions. Thus, each first isolation layer pattern 106a may include a lower portion having a first width in the third direction wider than a second width of an upper portion in the third direction. In example embodiments, the first height H1 may be substantially the same as the second height H2, and thus the first width of the lower portion of each first isolation layer pattern 106a may be substantially the same as the second width of the upper portion thereof.

The second isolation layer patterns 114 may be formed on the substrate 100 between the active patterns 110 and between the first isolation layer patterns 106a. For example, the second isolation layer patterns 114 may fill spaces defined by the active patterns 110 adjacent to each other in the third direction on the substrate 100, and spaces (one of which may be referred to as a second region Y) defined by the upper and lower portions of the first isolation layer patterns 106a and the active patterns 110 adjacent to the first isolation layer patterns 106a in the third direction.

The second isolation layer patterns 114 may electrically insulate the active patterns 110, and may include an insulating material, e.g., silicon oxide, silicon nitride, or combination thereof. However, the insulating material is not limited thereto. The insulating material used for the first and second isolation layer patterns 106a and 114 may be substantially the same as or different from each other.

The first and second isolation layer patterns 106a and 114 may be formed by different deposition processes. Therefore, an interface may be formed between the first and second isolation layer patterns 106a and 114 even if the first and second insulation layer patterns 106a and 114 are formed using substantially the same insulating material. Therefore, the first and second isolation layer patterns 106a and 114 may be distinguishable from each other.

The first and second isolation layer patterns 106a and 114 may not cover top surfaces of the active patterns 110 protruding from the substrate 100. Thus, the top surfaces of the active patterns 110 may be exposed.

The active patterns 110 may be arranged in a regular and repeated fashion. Thus, hereafter, a single active pattern 130a among the plurality of active patterns 110 may be explained together with 4 first isolation layer patterns 1, 2, 3 and 4 adjacent to the single active pattern 130a among the plurality of first isolation layer patterns 106a for the convenience of explanation.

As shown in the figures, the first isolation layer patterns 1 and 2 may contact first and second sidewalls (which are opposed to each other in the first direction) of the active pattern 130a, and the first isolation layer patterns 3 and 4 may contact third and fourth sidewalls (which are opposed to each other in a direction substantially perpendicular to the first direction) of the active pattern 130a. Thus, the first isolation layer patterns 1, 2, 3 and 4 may contact at least portions of all sidewalls of the first active pattern 130a. Thus, the active pattern 130a may be supported by the first isolation layer patterns 1, 2, 3 and 4.

Accordingly, the active patterns 110 may not collapse or incline, and the semiconductor device including the same may have an improved reliability even in the case that the active patterns have a relatively narrow width for a higher integration.

A shape of the top surfaces of the active patterns 110 is not limited to that of the active patterns 110 of FIG. 1. For example, the top surfaces of the active patterns may have various shapes.

Figure 4:
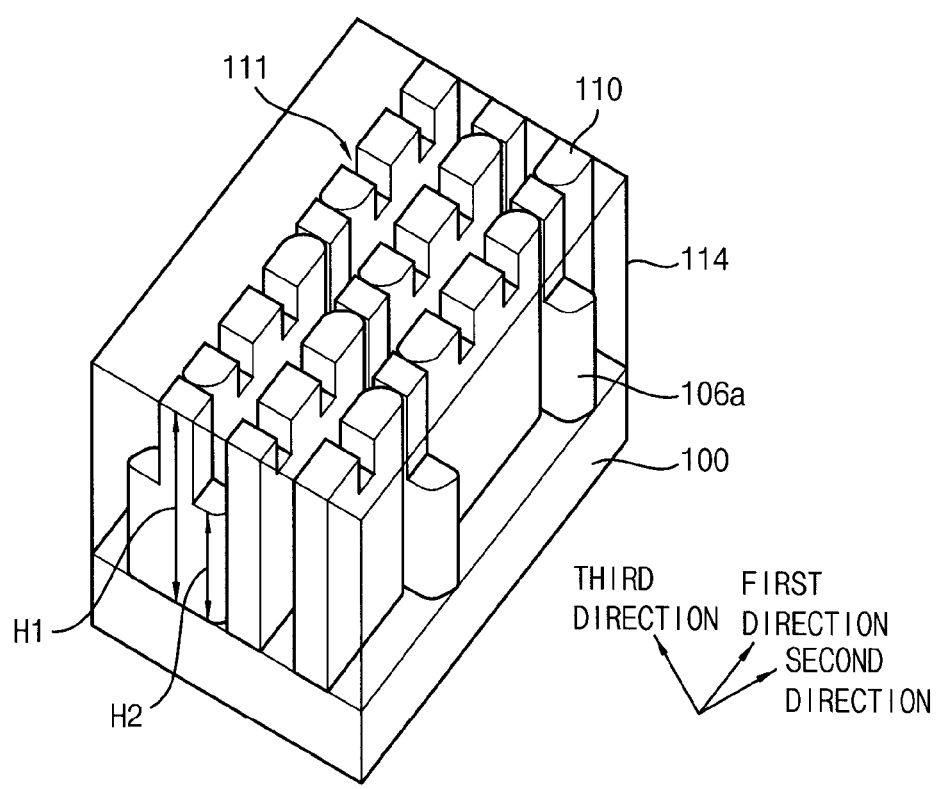

FIG. 4 is a perspective view illustrating a pattern of a semiconductor device in accordance with an example embodiment.

Referring to FIG. 4, the pattern of the semiconductor device may be substantially the same as the pattern of the semiconductor device in FIG. 1 except for a shape of the active pattern 110. At least one recess 111 (e.g., two recesses) may be formed on a top surface of each active pattern 110, and may provide a space to accommodate therein a gate electrode of a transistor (not shown).

FIGS. 5A to 5E are top views illustrating a method of manufacturing the pattern of the semiconductor device in FIGS. 1 and 2. FIGS. 6A to 6E are cross-sectional views cut along the line VI-VI' in FIGS. 5A to 5E. FIG. 7 is a perspective view illustrating the pattern in FIG. 5D.

Figure 5A:
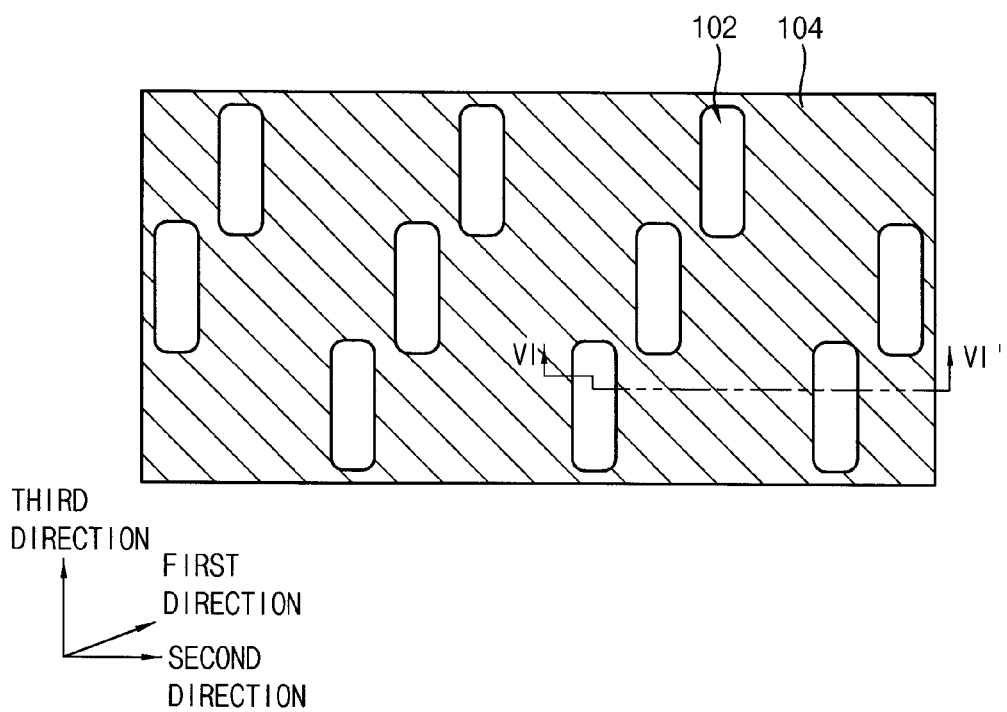
FIGS. 5A to 5E are top views illustrating a method of manufacturing the pattern of the semiconductor device in FIGS. 1 and 2.
Figure 6A:
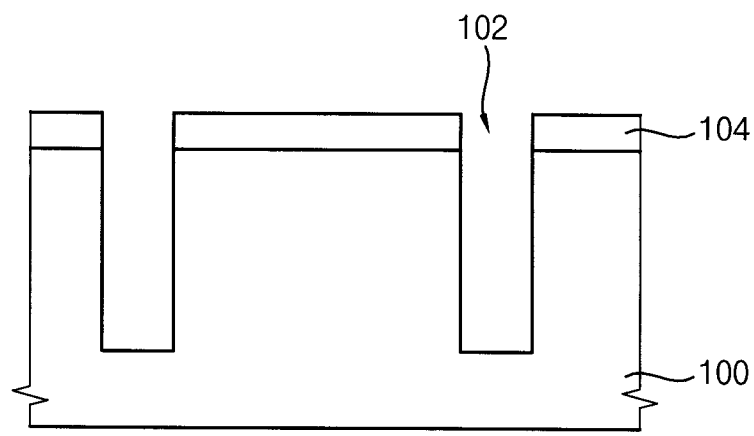
FIGS. 6A to 6E are cross-sectional views cut along the line VI-VI' in FIGS. 5A to 5E.
Figure 7:
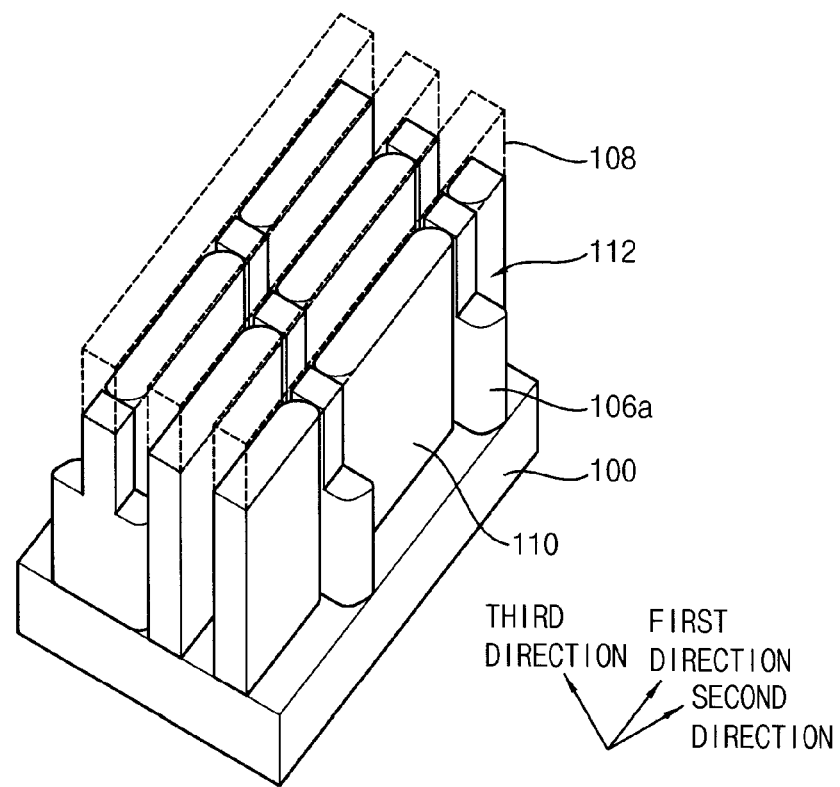

Referring to FIGS. 5A and 6A, a first mask 104 is formed on a substrate 100.

The first mask 104 exposes portions of the substrate 100 on which a preliminary first isolation layer pattern 106 (refer to FIG. 5B) is to be subsequently formed. Therefore, the first mask 104 exposes at least the first portion X, is a space between subsequently formed active patterns 110 arranged in the first direction (refer to FIG. 1). In example embodiments, the exposed portions by the first masks 104 may have an island-type shape from each other.

The exposed portions by the first mask 104 may be arranged in the first direction or in the second direction. The exposed portions by the first mask 104 may be arranged in a direction between the first direction and the third direction.

The substrate 100 may be etched using the first mask 104 as an etch mask to form a plurality of first trenches 102. In example embodiments, the substrate 100 may be anisotropically etched.

Figure 5B:
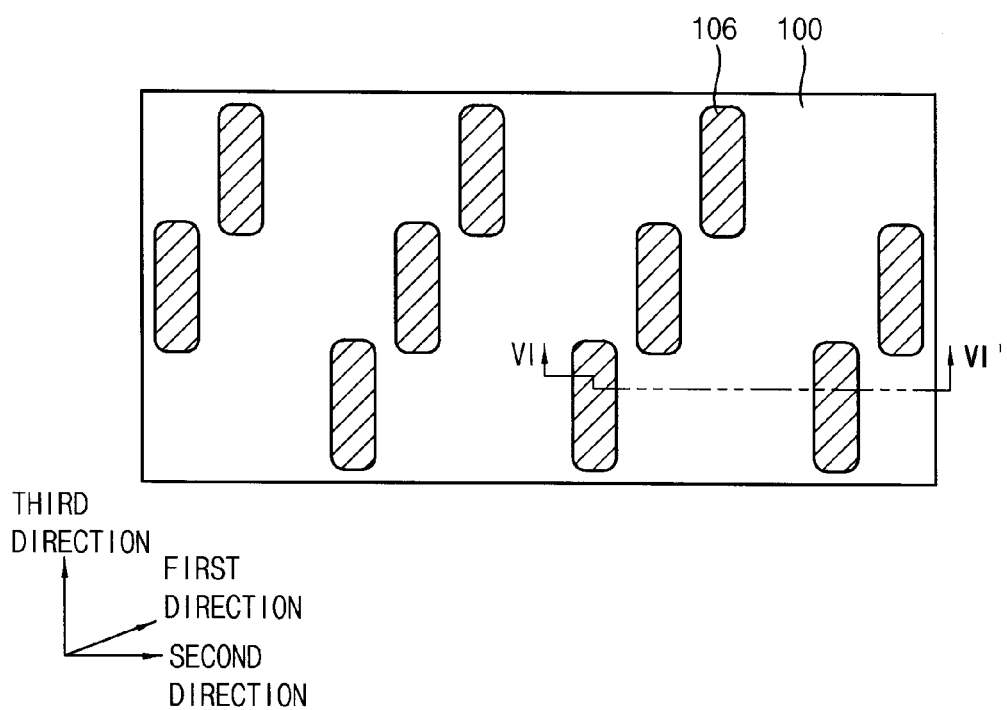
Figure 6B:
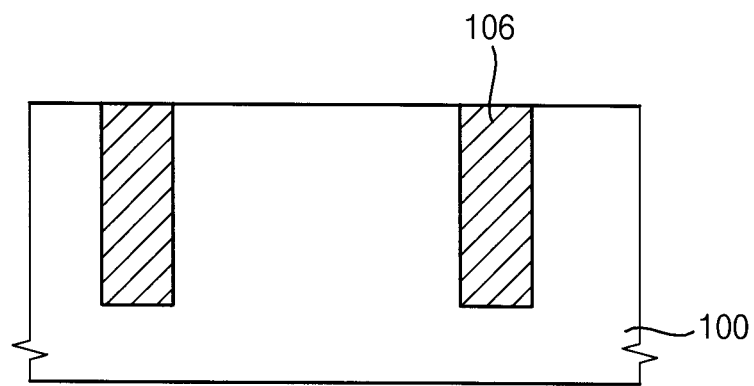

Referring to FIGS. 5B and 6B, after removing the first mask 104, a preliminary first isolation layer may be formed on the substrate 100 to sufficiently fill the first trenches 102. A cleaning process for cleaning inner walls of the first trenches 102 may be performed prior to forming the preliminary first isolation layer.

The preliminary first isolation layer may include, for example, silicon oxide, silicon nitride, or a combination thereof. However, the material for forming the preliminary first isolation layer is not limited thereto.

In an example embodiment, the preliminary first isolation layer may be formed by following processes.

A polysilicon layer (not shown) having a thin thickness, e.g., a thickness of several angstroms to hundreds of angstroms, may be formed on the inner walls of the first trenches 102, however, the process for forming the polysilicon layer may be skipped. A first silicon oxide layer may be formed on the polysilicon layer. The first silicon oxide layer may be formed by an atomic layer deposition (ALD) process. A silicon nitride layer may be formed on the first silicon oxide layer to sufficiently fill remaining portions of the first trenches 102.

The preliminary first isolation layer may include silicon oxide alone.

The preliminary first isolation layer may be planarized until a top surface of the substrate 100 may be exposed so that a plurality of preliminary first isolation layer patterns 106 filling the first trenches 102 may be formed. The planarization process may be performed by, e.g., a chemical mechanical polishing (CMP) process, or an etch back process.

Figure 5C:
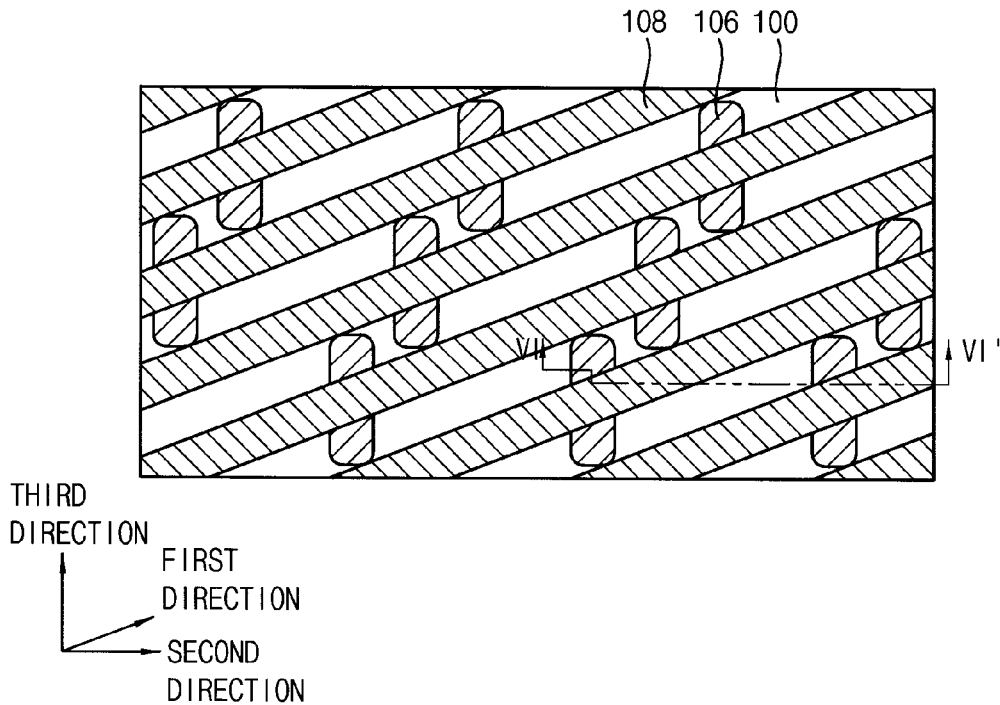
Figure 6C:
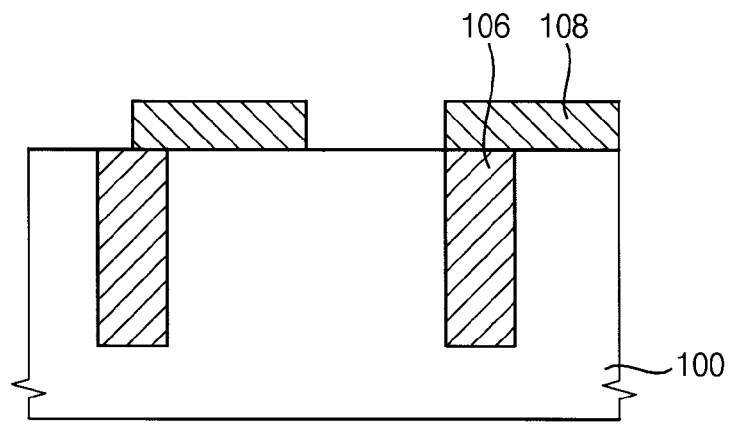

Referring to FIGS. 5C and 6C, a second mask 108 may be formed on the substrate 100 and the preliminary first isolation layer patterns 106. The second mask 108 may serve as an etch mask for forming the active patterns 110.

The second mask 108 may include a plurality of lines each of which may extend in the first direction. In example embodiments, the second mask 108 may be formed by a double patterning process or a quadruple patterning process.

The second mask 108 may cover central top surfaces of the preliminary first isolation layer patterns 106, and contact edge top surfaces of the preliminary first isolation layer patterns 106.

Figure 5D:
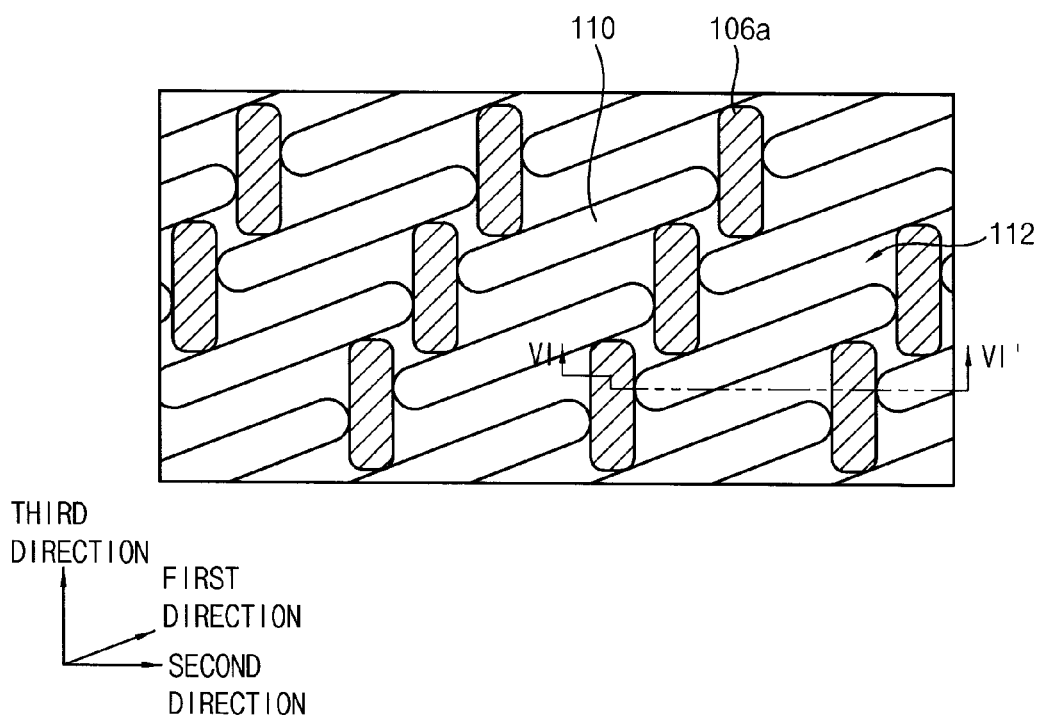
Figure 6D:
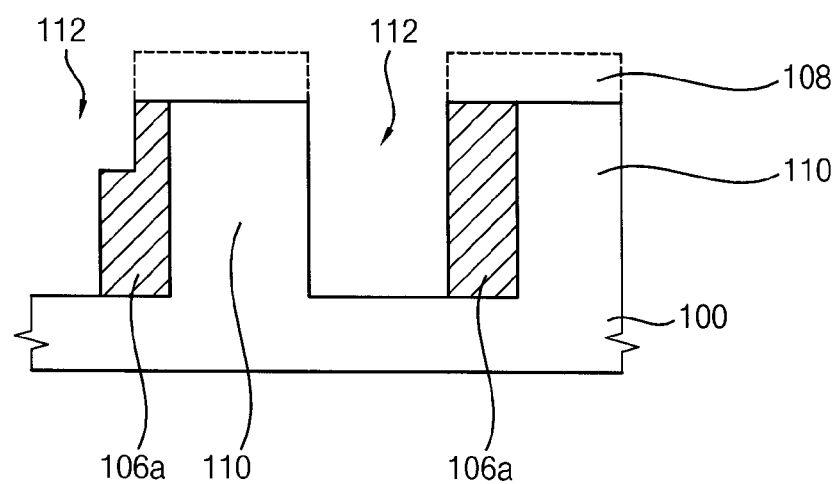

Referring to FIGS. 5D, 6D and 7, the substrate 100 may be etched using the second mask 108 as an etch mask to form a plurality of second trenches 112. Upper portions of the substrate 100 that are not etched by the etching process may be referred to as a plurality of active patterns. The substrate 100 may be anisotropically etched.

In the etching process, edge portions of the preliminary first isolation layer patterns 106 not covered by the second mask 108 may be partially etched so that a plurality of first isolation layer patterns 106a may be formed.

Thus, each first isolation layer pattern 106a may include a lower portion having a first width in the third direction wider than a second width of an upper portion thereof. In the case that the edge portions of the preliminary first isolation layer patterns 106 are hardly etched, the first width of the lower portion of each first isolation layer pattern 106a may be substantially the same as the second width of the upper portion thereof.

The active patterns 110 may be separated from each other by the first isolation layer patterns 106a in the first direction, and thus may have an island-type shape from each other. The active patterns 110 may be regularly arranged in the first direction. Each of the active patterns 110 may extend in the first direction, and thus may have a first length in the first direction. Each of the active patterns 110 may have a first width in a direction substantially perpendicular to the first direction.

In the etching process, portions of the substrate 100 and the preliminary first isolation layer patterns 106 may be repeatedly arranged in the first direction under the second mask 108. Therefore, the portions of the substrate 100 covered by the second mask 108 may be supported by the preliminary first isolation layer patterns 106.

Additionally, in the etching process, the substrate 100 may be etched while being supported by the preliminary first isolation layer patterns 106. For example, the preliminary first isolation layer patterns 106 may support unetched portions of the substrate 100 when the substrate 100 is etched. Therefore, the active patterns 110 may not collapse or incline.

The first isolation layer patterns 106a may be formed to contact two sidewalls (which are opposed to each other in the first direction) of each active pattern 110, and two sidewalls thereof provided in a direction substantially perpendicular to the first direction. Thus, each active pattern 110 may be supported by 4 first isolation layer patterns 106a.

Figure 5E:
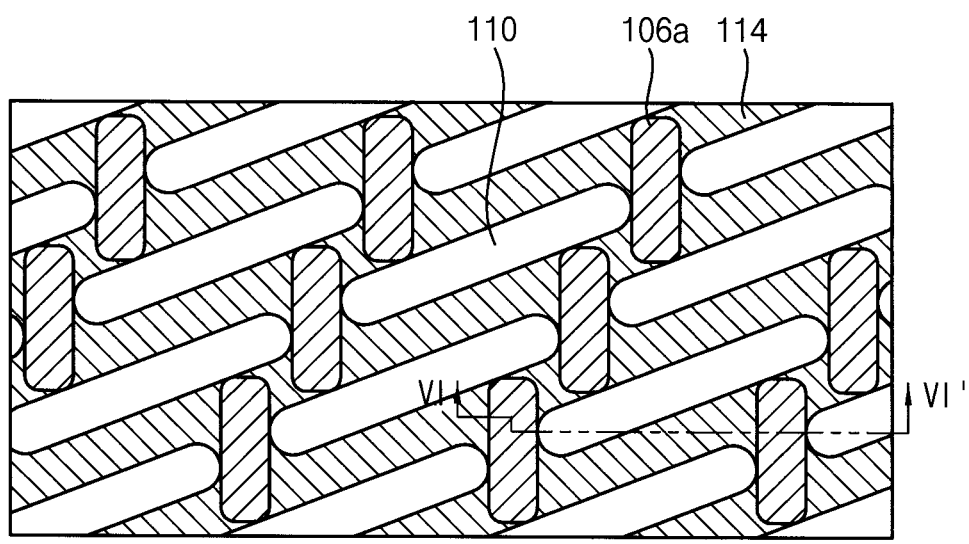
Figure 6E:
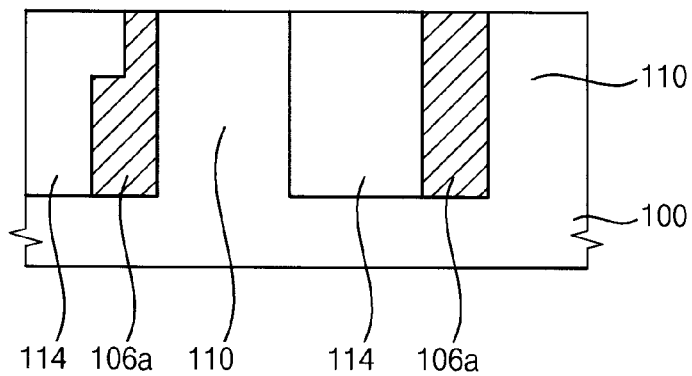

Referring to FIGS. 5E and 6E, a second isolation layer may fill portions between the active patterns 110 and between the first isolation layer patterns 106a. A cleaning process for cleaning the active patterns 110 may be performed prior to forming the second isolation layer.

The second isolation layer may be formed to include an insulating material, e.g., silicon oxide, silicon nitride, or a combination thereof. However, the material for the second isolation layer is not limited thereto.

In example embodiments, the second isolation layer may be formed by following processes.

A polysilicon layer (not shown) having a thin thickness, e.g., a thickness of several angstroms to hundreds of angstroms, may be formed on upper surfaces of the active patterns 110 and the first isolation layer patterns 106a, however, the process for forming the polysilicon layer may be skipped. A first silicon oxide layer may be formed on the polysilicon layer. The first silicon oxide layer may be formed by an ALD process. A silicon nitride layer may be formed on the first silicon oxide layer to sufficiently fill remaining portions of the second trenches 112.

The second isolation layer may include silicon oxide alone.

The second isolation layer may be planarized until a top surface of the substrate 100 may be exposed to form a plurality of second isolation layer patterns 114.

The first and second isolation layer patterns 106a and 114 may be formed by different deposition processes. Therefore, an interface may be formed between the first and second isolating layer pattern 106a and 114 even if the first and second insulation layer patterns 106a and 114 are formed using substantially the same insulating material. Therefore, the first and second isolation layer patterns 106a and 114 may be distinguishable from each other.

The active patterns 110 (i.e., patterns serving as active regions of the semiconductor device) may be formed by the above processes. The sidewalls of the active patterns 110 may be supported by the first isolation layer patterns 106a. Therefore, the active patterns 110 may not collapse or incline even when the active patterns have a relatively narrow width and/or a relatively high aspect ratio. Thus, the semiconductor device including the active patterns 110 may have an improved reliability and/or a higher degree of integration.

Figure 8:
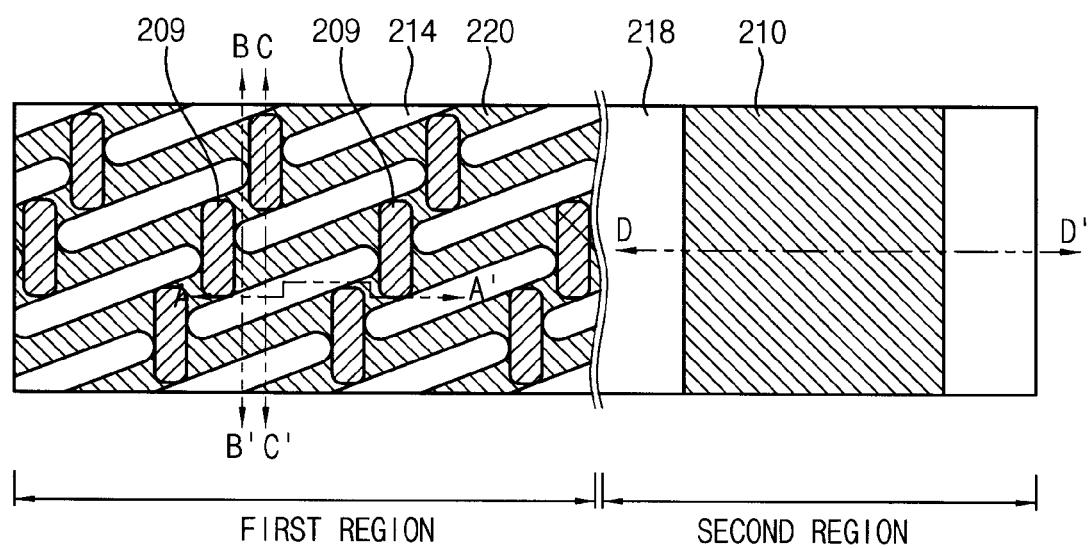
Figure 9:
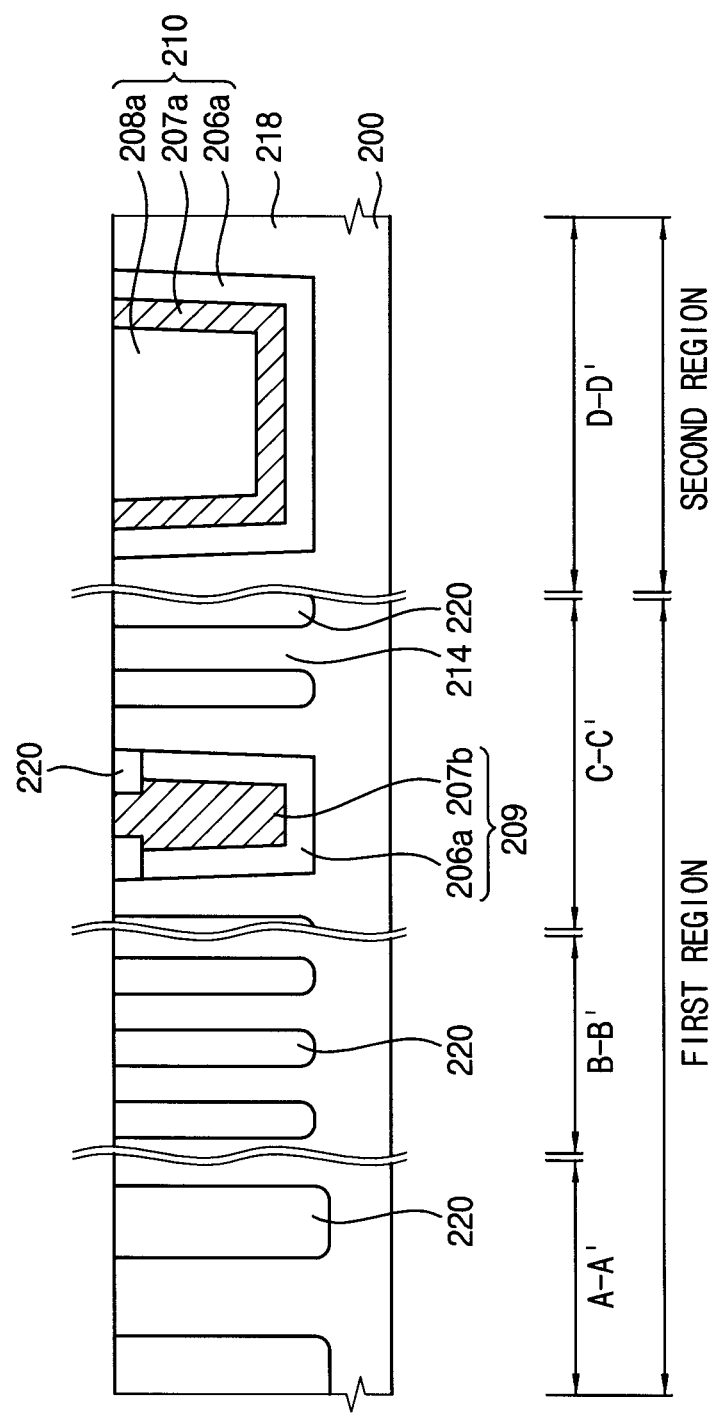

FIG. 8 is a top view illustrating a pattern of a semiconductor device in accordance with an example embodiment. FIG. 9 is a cross-sectional view of the pattern of the semiconductor device in FIG. 8.

Referring to FIG. 8, a substrate 200 may include a first region and a second region. A density of patterns in the first region may be higher than that of patterns in the second region. For example, the first region may serve as a cell region of the semiconductor device, and the second region may serve as a peripheral region.

In the first region, patterns, e.g., a plurality of first active patterns 214, a plurality of first isolation layer pattern structures 209 and a plurality of second isolation layer patterns 220 may be formed on the substrate 200. The first isolation layer pattern structures 209 and the second isolation layer patterns 220 may be formed by different deposition processes, and thus an interface maybe formed between the first and second isolation layer patterns 209 and 220. Each first isolation layer pattern structure 209 may include a first silicon oxide layer pattern 206a and a second nitride layer pattern 207b.

In the second region, a plurality of second active patterns 218 and a third isolation layer pattern structure 210 may be formed on the substrate 200. A width of each second active pattern 218 may be wider than that of each first active pattern 214, and a density of the second active patterns 218 may be lower than that of the first active patterns 214. Thus, the second active patterns 218 may not collapse or incline even without an extra pattern supporting the second active patterns 218. Thus, the extra pattern supporting the second active patterns 218 may not be formed in the second region.

The third isolation layer patternstructure 210 may be formed in a process for forming the first isolation layer patternstructure 209. The third isolation layer pattern 210 may include the first silicon oxide layer pattern 206a, a first silicon nitride layer pattern 207a, and the second silicon oxide layer pattern 208a. Therefore, the third isolation layer pattern structure 210 may include at least one insulating material substantially the same as that of the first isolation layer patternstructure 209.

In example embodiments, elements of a DRAM device may be further formed on the pattern shown in FIGS. 8 and 9.

Cell elements of the DRAM device, e.g., a gate structure, a bit line, and a capacitor may be formed in the first region. The gate structure may be a buried gate structure, or a planar gate structure on the first active pattern 214.

For example, transistors for peripheral circuits may be formed in the second region.

Sidewalls of the first active patterns 214, which have a relatively high density and a relatively narrow width, may be supported by the first isolation layer pattern structure 209.

Therefore, the first active patterns 214 may not collapse or incline, and the semiconductor device including the same may have an improved reliability and/or a higher degree of integration.

FIGS. 10A to 10E are cross-sectional views illustrating a method of manufacturing the pattern of the semiconductor device in FIGS. 8 and 9. FIGS. 11A to 11C are top views illustrating a method of manufacturing the pattern of the semiconductor device in FIGS. 8 and 9.

Referring to FIG. 10A, a first mask (not shown) exposing top surfaces of a substrate 200 may be formed on the substrate 200 including a first region and a second region.

The substrate 200 may be partially etched using the first mask as an etching mask to form a plurality of first trenches 202 in the first region and a second trench 204 in the second region. The second trench 204 may have a width wider than those of the first trenches 202. The etching process may include an anisotropic etch process.

Referring to FIG. 10B, a polysilicon layer (not shown) may be formed on inner walls of the first and second trenches 202 and 204, however, the process for forming the polysilicon layer may be skipped. A first silicon oxide layer 206 may be formed on the polysilicon layer. The first silicon oxide layer may be formed by an ALD process. A silicon nitride layer 207 may be formed on the first silicon oxide layer 206. The silicon nitride layer 207 may completely fill remaining portions of the first trenches 202, whereas the silicon nitride layer 207 may not completely fill the second trench 204. A second silicon oxide layer 208 may be formed on the silicon nitride layer 207 to completely fill remaining portions of the second trench 204. The second silicon oxide layer 208 may be formed using a material having good gap fill characteristics.

In the second region, a portion of the substrate 200 on which no second trench 204 is formed may serve as a second active pattern 218.

Figure 10C:
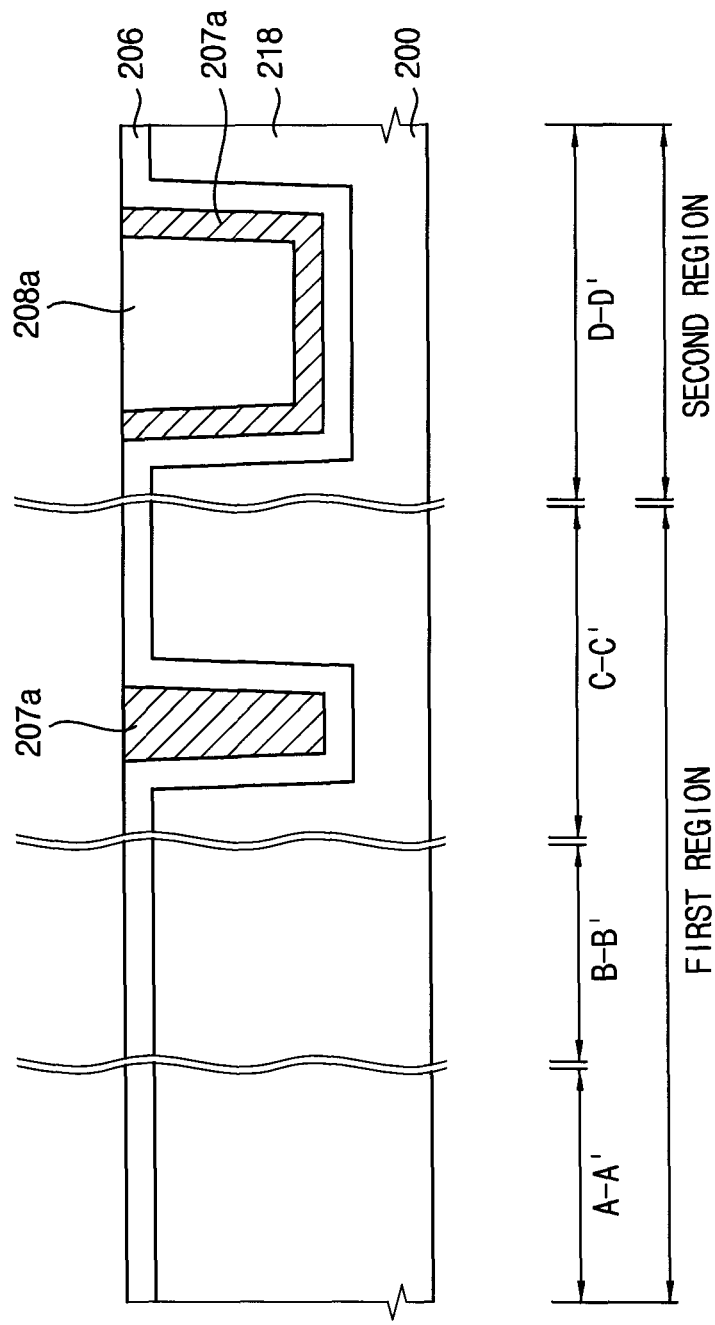
Figure 11A:
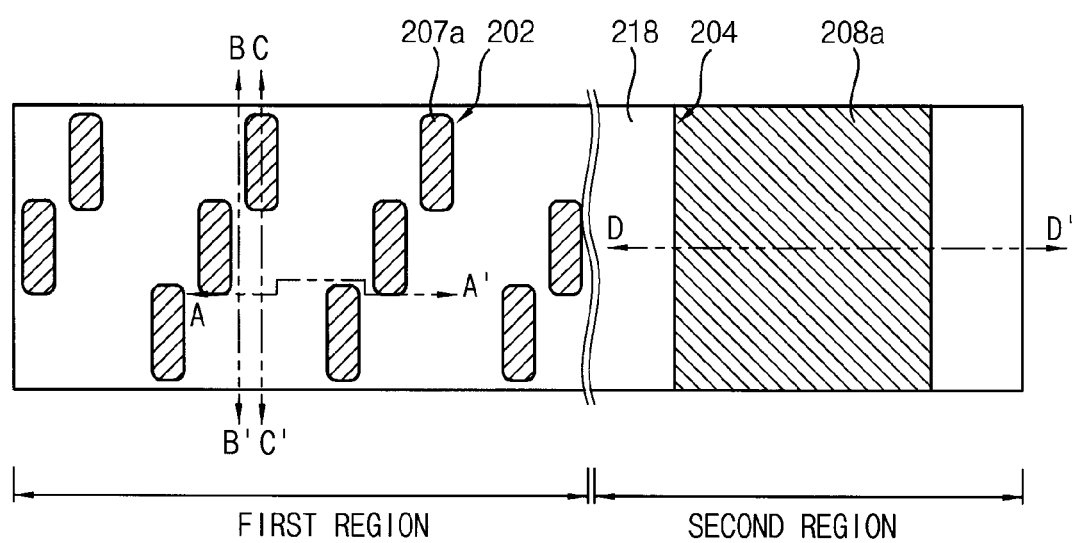
FIGS. 11A to 11C are top views illustrating a method of manufacturing the pattern of the semiconductor device in FIGS. 8 and 9.
Figure 11B:
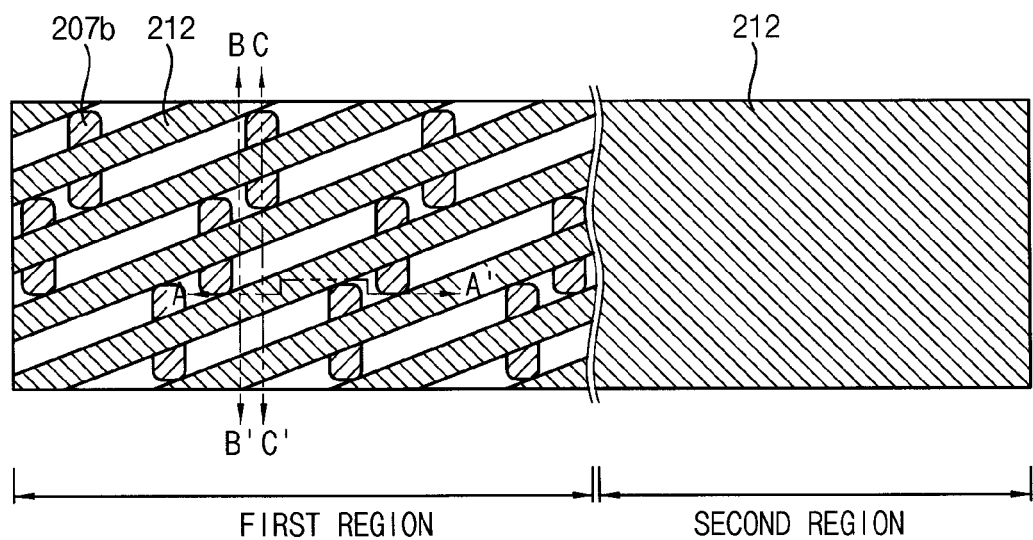
Figure 11C:
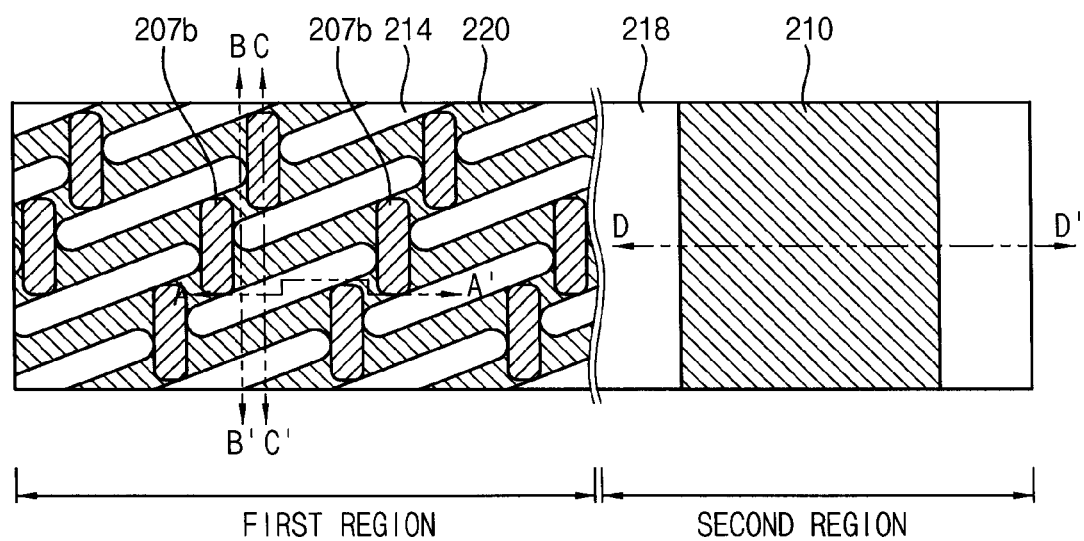

Referring to FIGS. 10C and 11A, upper portions of the second oxide layer 208 and the silicon nitride layer 207 may be planarized to form a second oxide layer pattern 208a and a plurality of first silicon nitride layer patterns 207a, respectively. In example embodiments, the second oxide layer pattern 208a may be formed in the second trench 204 in the second region, and the first silicon nitride layer patterns 207a may be formed in each of the first trenches 202 in the first region and in the second trench 204 in the second region.

Figure 10D:
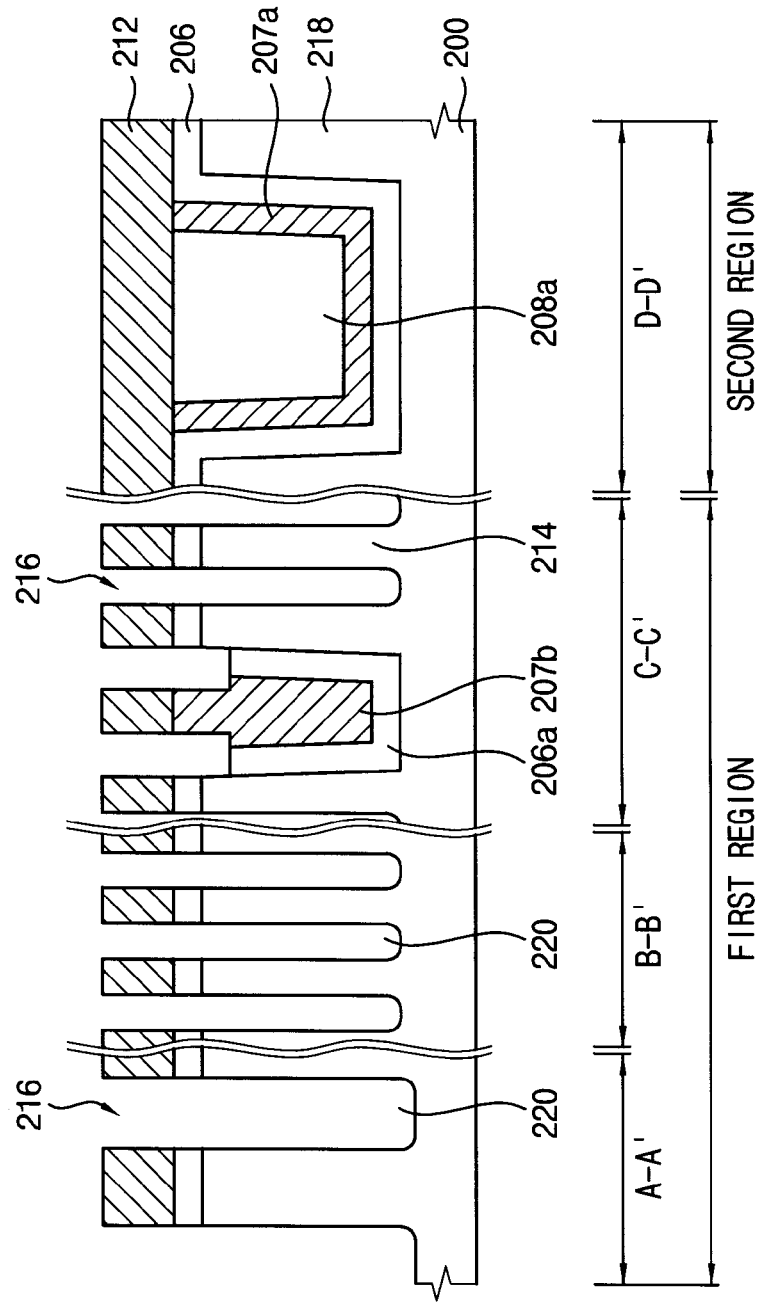

Referring to FIGS. 10D and 11B, a second mask 212 may be formed on the first silicon oxide layer 206, the first silicon nitride layer patterns 207a and the second silicon oxide layer pattern 208a. The second mask 212 may completely cover the second region and desired portions of the first region.

In the first region, the second mask 212 may have a plurality of lines each of which extends in the first direction and cover central top surfaces of the first silicon nitride layer patterns 207a. The second mask 212 may be formed by a double patterning process or a quadruple patterning process.

The first silicon nitride layer patterns 207a and the first silicon oxide layer 206 that are not covered by the second mask 212 in the first region, and portions of the substrate 200 under the second mask 212 in the first region may be sequentially etched using the second mask 212 as an etch mask to form a plurality of third trenches 216. Thus, a plurality of second silicon nitride layer patterns 207b and a plurality of first silicon oxide layer patterns 206a may be formed in the first region. Additionally, a plurality of first active patterns 214 may be formed in the first region.

Referring to FIGS. 10E and 11C, after removing the second mask 212, a second isolation layer filling the third trenches 216 may be formed.

A cleaning process for cleaning surfaces of the first active patterns 214 may be performed prior to forming the second isolation layer.

The second isolation layer may include an insulating material, e.g., silicon oxide, silicon nitride, or a combination thereof.

An upper portion of the second isolation layer may be planarized until a top surface of the substrate 200 may be exposed to form a plurality of second isolation layer patterns 220.

In the planarization process, an upper portion of the first silicon oxide layer 206a in the first region may be also removed. Further, upper portions of the second silicon oxide layer pattern 208a, the first silicon nitride layer pattern 207a, and the first silicon oxide layer 206 in the second region may be also planarized. Thus, the first silicon oxide layer 206 may be converted into the first silicon oxide layer pattern 206a in the second region.

The first silicon oxide layer pattern 206a and the second silicon nitride layer pattern 207b in the first region may be referred to as a first isolation layer pattern structure 209, and the first silicon oxide layer pattern 206a, the first silicon nitride layer pattern 207a, and the second oxide layer pattern 208a in the second region may be referred to as a third isolation layer patternstructure 210.

In example embodiments, elements for a DRAM device may be formed on these patterns, and the DRAM device may have an improved reliability even at a higher degree of integration.

Figure 12:
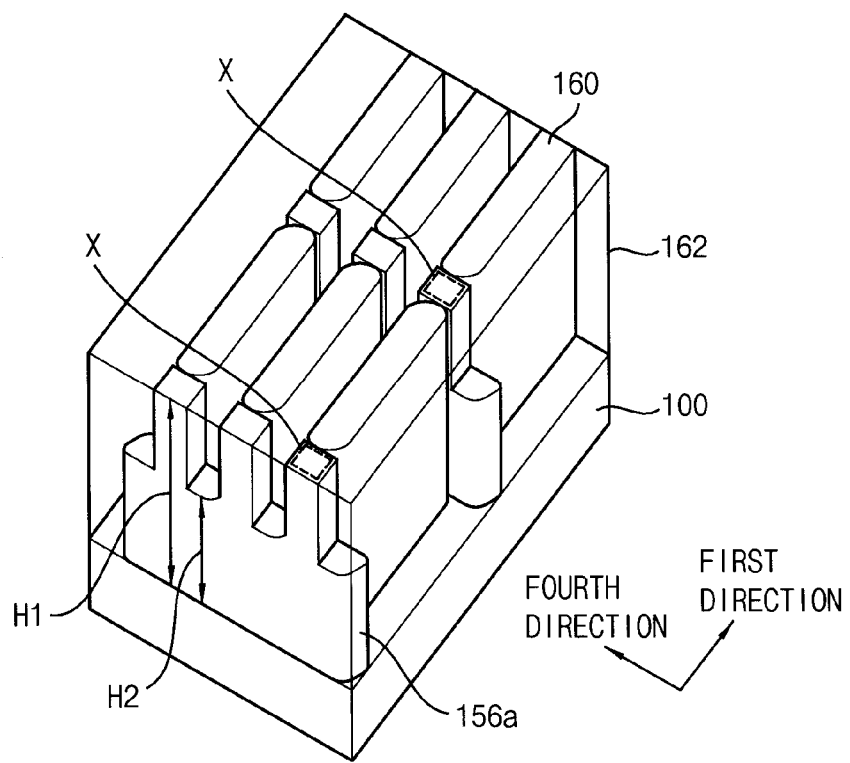
Figure 13:
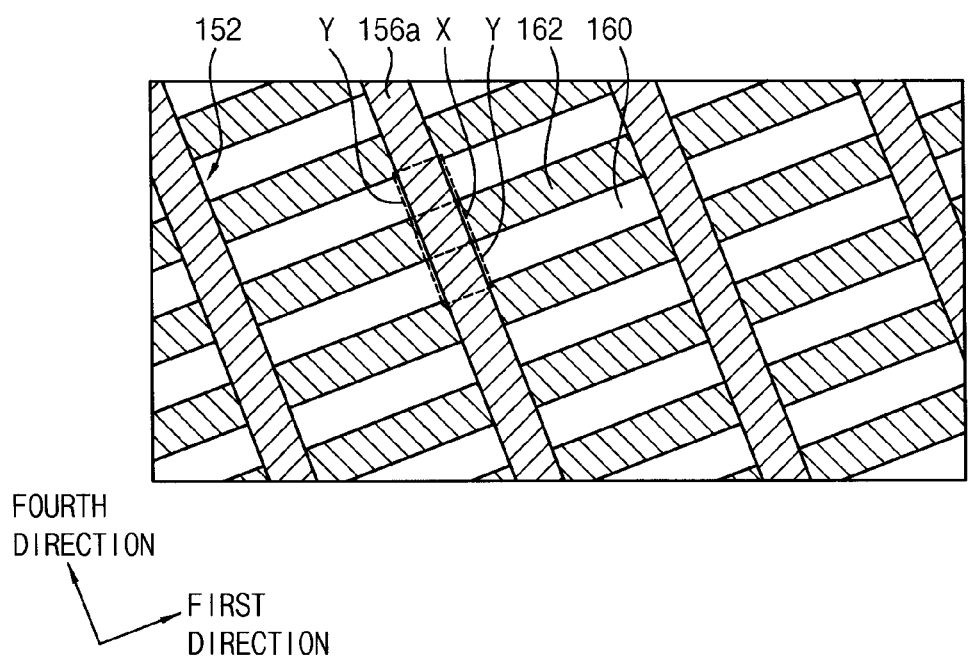
Figure 14:
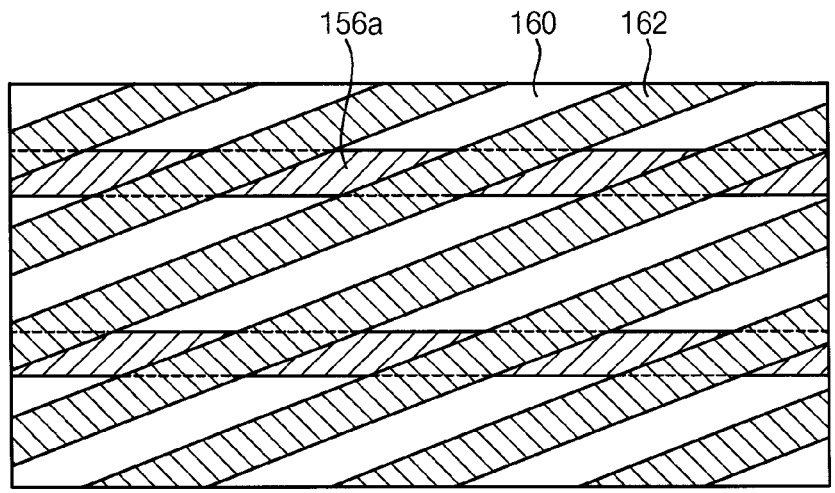

FIG. 12 is a perspective view illustrating patterns of a semiconductor device in accordance with an example embodiment. FIG. 13 is a top view illustrating the patterns of the semiconductor device in FIG. 12. FIG. 14 is a top view illustrating patterns of a semiconductor device in FIG. 12 in accordance with another example embodiment.

The patterns of the semiconductor device in FIGS. 12 to 14 may be substantially the same as those in FIG. 1 except for a shape of components in the semiconductor device. Therefore, only different characteristics of the pattern of the semiconductor device in FIG. 12 from those in FIG. 1 will be illustrated herein below.

Referring to FIGS. 12 to 14, the patterns of the semiconductor device may include a plurality of active patterns 160 protruding from a substrate 100, a plurality of first isolation layer patterns 156a and a plurality of second isolation layer patterns 162.

The active patterns 160 may be integrally formed with the substrate 100. For example, the active patterns 160 may be formed by patterning upper portions of the initial substrate 100, and the patterned upper portions of the initial substrate 100 may be defined as the active patterns 160.

The active patterns 160 may serve as an active region. The active patterns 160 may have an island-type shape from each other.

The active patterns 160 may be spaced apart from each other at a first distance in the first direction. The active patterns 160 may be arranged in various types.

The active patterns 160 may be spaced apart from each other in a fourth direction which is different from the first direction.

In example embodiments, the fourth direction may be substantially perpendicular to the first direction as shown in the FIGS. 12 and 13. The fourth direction may not be perpendicular to the first direction (refer FIG. 14). For example, the fourth direction may be substantially the same as the second direction in FIG. 1.

The first isolation layer patterns 156a may be spaced apart from each other in the first direction and each first isolation layer pattern 156a may extend in the fourth direction in a first trench 152. The first isolation layer patterns 156a may fill spaces between the active patterns 160 arranged in the first direction, each of which may be referred to as a first region X, and extend from the first region X in the fourth direction. The first isolation layer patterns 156a may directly contact sidewalls of the active patterns 160.

Each first isolation layer pattern 156a may have a first height H1 at the first region X higher than a second height H2 at other regions. The first height H1 may be substantially the same as the second height H2. Each first isolation layer pattern 156a extending in the fourth direction may have a protruded upper surface, e.g., a plurality of bumps arranged in the fourth direction. The bumps of each first isolation layer pattern 156a may be upper portions thereof, and other portions of each first isolation layer pattern 156a may be lower portions thereof.

The first isolation layer patterns 156a may contact two sidewalls of each active pattern 160 opposed to each other in the first direction to support the first active pattern 160. Accordingly, the active patterns 160 may not collapse or incline, and the semiconductor device including the pattern may have a high reliability even at a higher degree of integration.

The first isolation layer patterns 156a may electrically insulate the active patterns 160, and may include an insulating material, e.g., silicon oxide, silicon nitride, or a combination thereof. However, the insulating material is not limited thereto.

The second isolation layer patterns 162 may be formed on the substrate 100 between the active patterns 160 and the first isolation layer patterns 156a. For example, the second isolation layer patterns 162 may fill spaces defined by the active patterns 160 adjacent to each other in the fourth direction on the substrate 100, and spaces defined by the upper and lower portions of the first isolation layer patterns 156a (each of which may be referred to as the second region Y).

The second isolation layer pattern 162 may electrically insulate the active patterns 160, and may include an insulating material, e.g., silicon oxide, silicon nitride, or a combination thereof. However, the material for forming the second isolation layer patterns 162 is not limited thereto. The material for forming the first and second isolation layer patterns 156a and 162 may be substantially the same as or different from each other.

The first and second isolation layer patterns 156a and 162 may be formed by different deposition processes. Therefore, an interface may be formed between the first and second insulation layer patterns 156a and 162 even if the first and second insulation layer patterns 156a and 162 are formed using substantially the same insulating material. Therefore, the first and second isolation layer patterns 156a and 162 may be distinguishable from each other.

The patterns of the semiconductor device may include the active patterns 160 having portions supported by the first isolation layer patterns 156a in the first direction. Therefore, the active patterns 160 may not fall down or incline, and the semiconductor device including the pattern may have a high reliability even at a higher degree of integration.

A shape of the active patterns 160 is not limited that of FIGS. 12 and 13, and may be modified in accordance with devices formed thereon.

In example embodiments, as shown in FIG. 4, a recess may be formed on a top surface of the active pattern. A gate electrode of a recess transistor may be formed on the recess.

FIGS. 15A to 15D are top views illustrating a method of manufacturing the patterns of the semiconductor device in FIG. 14.

Figure 15A:
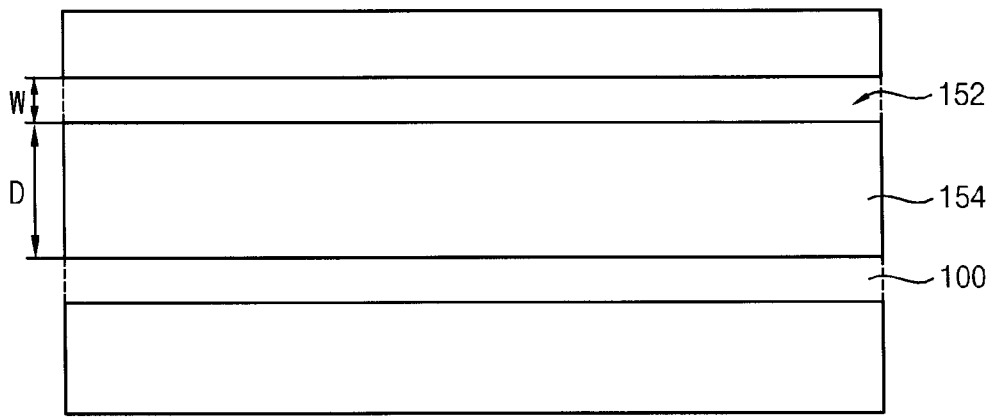
FIGS. 15A to 15D are top views illustrating a method of manufacturing the patterns of the semiconductor device in FIG. 14.

Referring to FIG. 15A, a first mask (not shown) may be formed on a substrate 100.

The first mask may include a plurality of lines each of which may extend in the fourth direction, and thus may expose top surfaces of the substrate 100.

A distance between the exposed top surfaces of the substrate 100 may be greater than a width of each exposed top surface of the substrate 100. For example, the distance between the exposed top surfaces of the substrate 100 may be at least three times the width of each exposed top surface of the substrate 100.

Each of the lines of the first mask may extend in the fourth direction having an angle with respect to the first direction. In example embodiments, the fourth direction may be substantially the same as the second direction.

In other example embodiments, the fourth direction may be substantially perpendicular to the first direction. When the first mask is formed to extend in a direction substantially perpendicular to the first direction, the patterns of the semiconductor device in FIGS. 12 and 13 may be formed.

The substrate 100 may be etched using the first mask as an etch mask to form a plurality of first trenches 152 on the substrate 100, and a plurality of preliminary active patterns 154.

A distance D of each preliminary active pattern 154 may be greater than a width W of each first trench. For example, the distance D may be at least three times the width W. Thus, the active patterns 154 may not collapse or incline when the preliminary active patterns 154 are formed. The width W may vary in accordance with the angle of the first mask to the first direction and a length of active patterns to be formed.

Figure 15B:
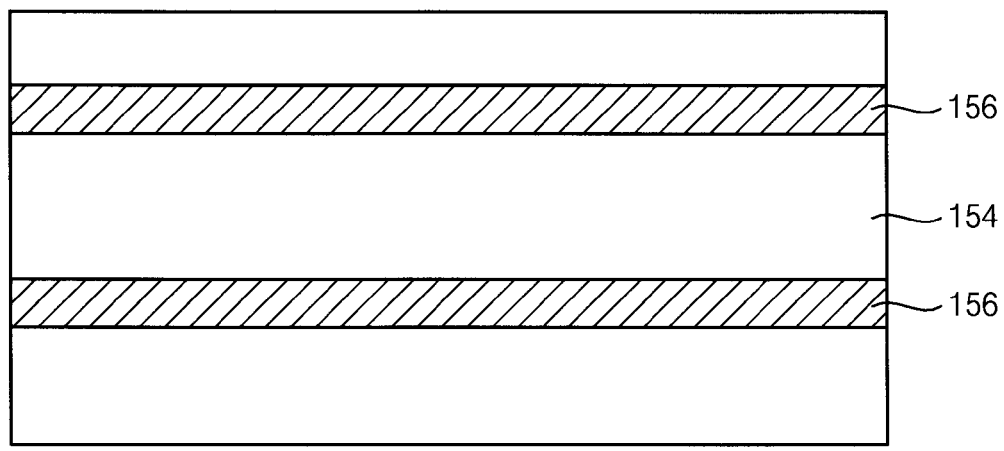

Referring to FIG. 15B, after removing the first mask, a preliminary first isolation layer may be formed on the substrate 100 to fill the first trenches 152. A cleaning process may be performed prior to forming the preliminary first isolation layer.

The preliminary first isolation layer may include, e.g., silicon oxide, silicon nitride, or a combination thereof. However, the material for the preliminary first isolation layer is not limited thereto.

An upper portion of the preliminary first isolation layer may be planarized to expose a top surface of the substrate 100 to form a plurality of first preliminary isolation layer patterns 156.

Figure 15C:
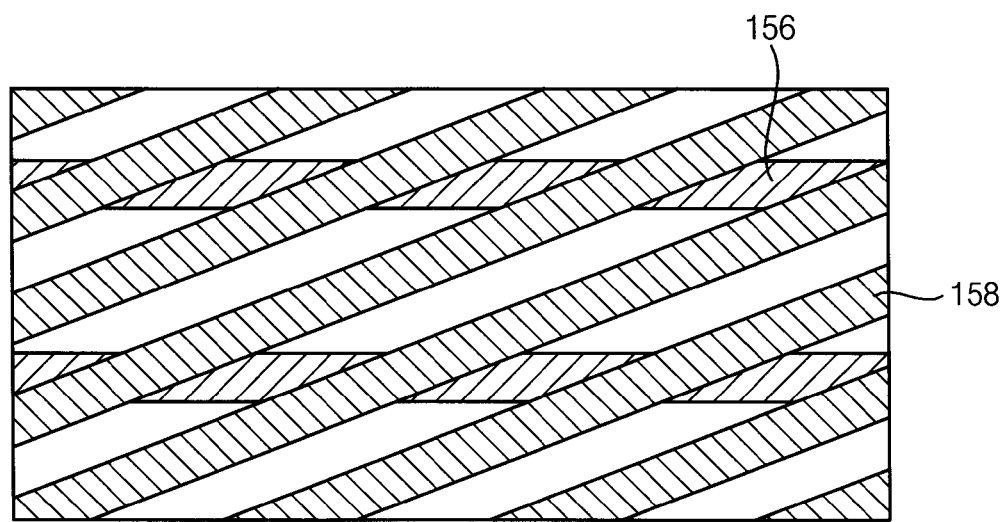

Referring to FIG. 15C, a second mask 158 may be formed on the substrate 100 and the preliminary first isolation layer patterns 156.

The second mask 158 may be formed by a photolithography process. The second mask 158 may be formed by a double patterning process or a quadruple patterning process.

The second mask 158 may include a plurality of lines, each of which extends in the first direction. The second mask 158 may partially cover the substrate 100 and the preliminary first isolation layer patterns 156.

Figure 15D:
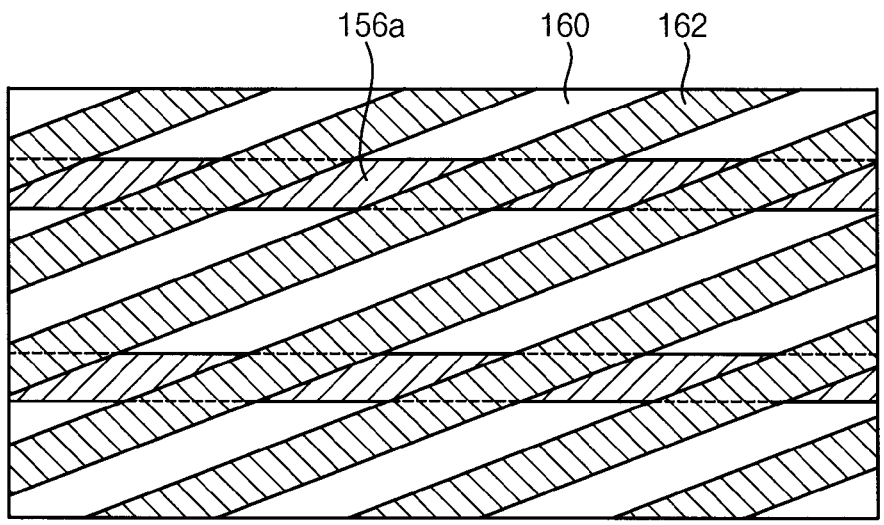

Referring to FIG. 15D, the substrate 100 may be partially etched using the second mask 158 as an etching mask to form a plurality of active patterns 160. The etching process may include an anisotropic etch process. In the etching process, portions of the preliminary first isolation layer patterns 156 that are not covered by the second mask 158 may be also etched to form a plurality of first isolation layer patterns 156a. The portions of the preliminary first isolation layer patterns 156 that are not covered by the second mask 158 may be slowly etched or hardly etched when compared to the substrate 100. Each of the first isolation layer patterns 156a may be formed to extend in the fourth direction and have an uneven top surface, e.g., have a plurality of bumps disposed in the fourth direction. When the preliminary first isolation layer patterns 156 are hardly etched, each first isolation layer pattern 156a may have an even top surface.

The active patterns 160 may be separated from each other by the first isolation layer patterns 156a in the first direction, and thus may have an island-type shape from each other. The active patterns 160 may be regularly arranged in the first direction.

In the etching process, the substrate 100 covered by the second mask 158 may be supported by the preliminary first isolation layer patterns 156a. In other words, when the active patterns 160 are formed, the preliminary first isolation layer patterns 156a may support unetched portions of the substrate 100. Therefore, the active patterns 160 may not collapse or incline.

A preliminary second isolation layer filling spaces between the active patterns 160 and between the first isolation layer patterns 156a may be formed.

A cleaning process for cleaning the active patterns 110 may be performed prior to forming the preliminary second isolation layer.

The preliminary second isolation layer may be formed to include an insulating material e.g., silicon oxide, silicon nitride, etc. These may be used alone or in a combination thereof, and the material for preliminary second isolation layer is not limited thereto.

The first isolation layer patterns 156a and the preliminary second isolation layer may be formed by different deposition processes. Therefore, an interface may be formed between the first isolation layer patterns 156a and the preliminary second isolation layer even if the first isolation layer patterns 156a and the preliminary second isolation layer are formed using substantially the same insulating material.

An upper portion of the preliminary second isolation layer may be planarized until a top surface of the substrate 100 may be exposed to form a plurality of second isolation layer patterns 162.

Figure 16:
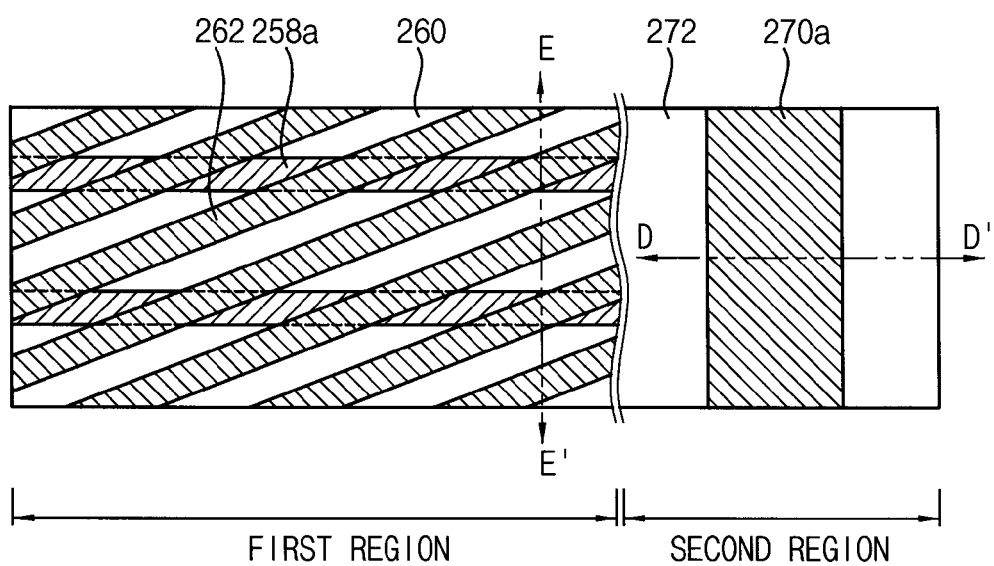

FIG. 16 is a top view illustrating a pattern of a semiconductor device in accordance with an example embodiment.

Referring to FIG. 16, a substrate (not shown) may include a first region and a second region. A density of patterns in the first region may be higher than that of patterns in the second region. For example, the first region may serve as a cell region of the semiconductor device, and the second region may serve as a peripheral region.

In the first region, patterns, e.g., a plurality of first active patterns 260, a plurality of first isolation layer patterns 258a, and a plurality of second isolation layer patterns 262, may be formed on the substrate. The first isolation layer patterns 258a and second isolation layer patterns 262 may be formed by different deposition processes. Thus an interface maybe formed between the first isolation layer patterns 258a and second isolation layer patterns 262.

In the second region, a plurality of second active patterns 272 and a third isolation layer pattern 270a may be formed on the substrate. A width of each second active pattern 272 may be substantially wider than that of each first active pattern 260, and a density of the second active patterns 272 may be lower than that of the first active patterns 260. Therefore, the second active patterns 272 may not collapse or incline even without an extra pattern supporting the second active patterns 272. Thus, the extra pattern supporting the second active patterns 272 may not be formed in the second region. The third isolation layer pattern 270a may be formed to include at least one insulating material substantially the same as that of the first isolation layer pattern 260

In example embodiments, elements of a DRAM device (not shown) may be further formed on the pattern shown in FIG. 16. In addition, elements of a cell region of the semiconductor device may be formed on the first region, and elements of a peripheral region of the semiconductor device may be formed on the second region.

Figure 17A:
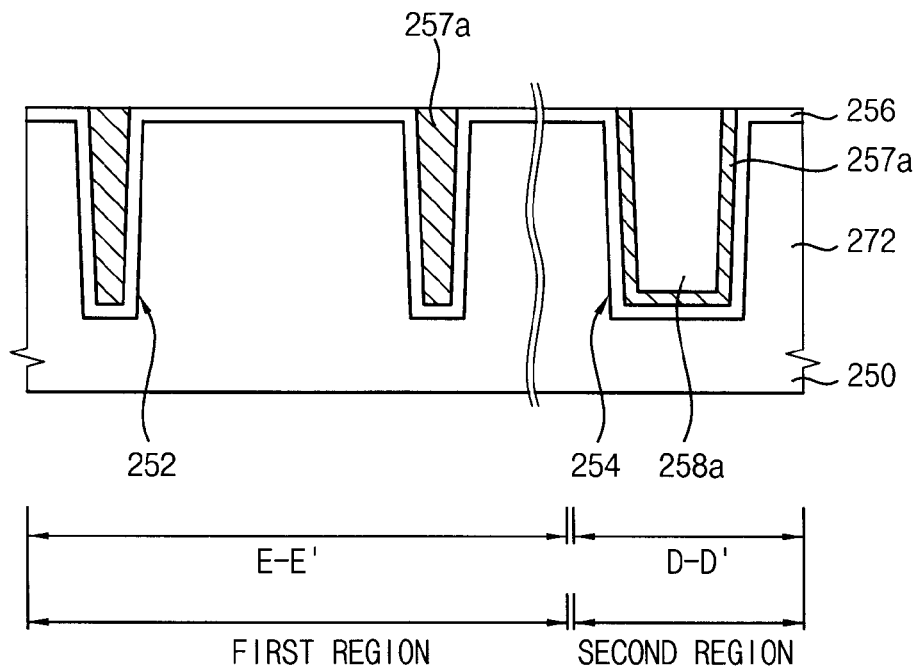
FIGS. 17A to 17C are cross-sectional views illustrating a method of manufacturing the pattern of the semiconductor device in FIG. 16.
Figure 17B:
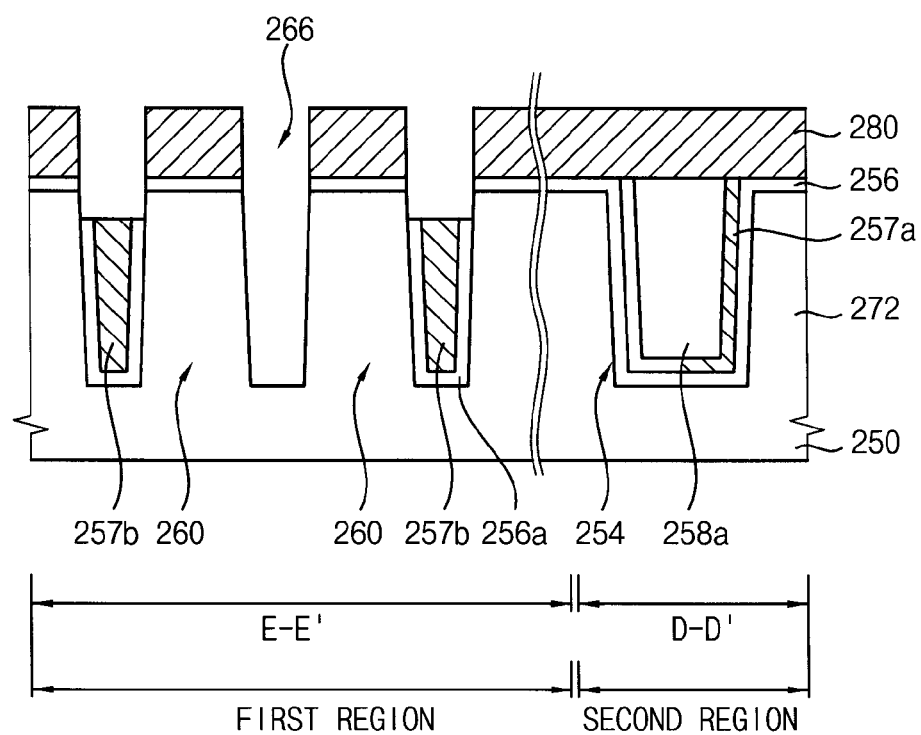
Figure 17C:
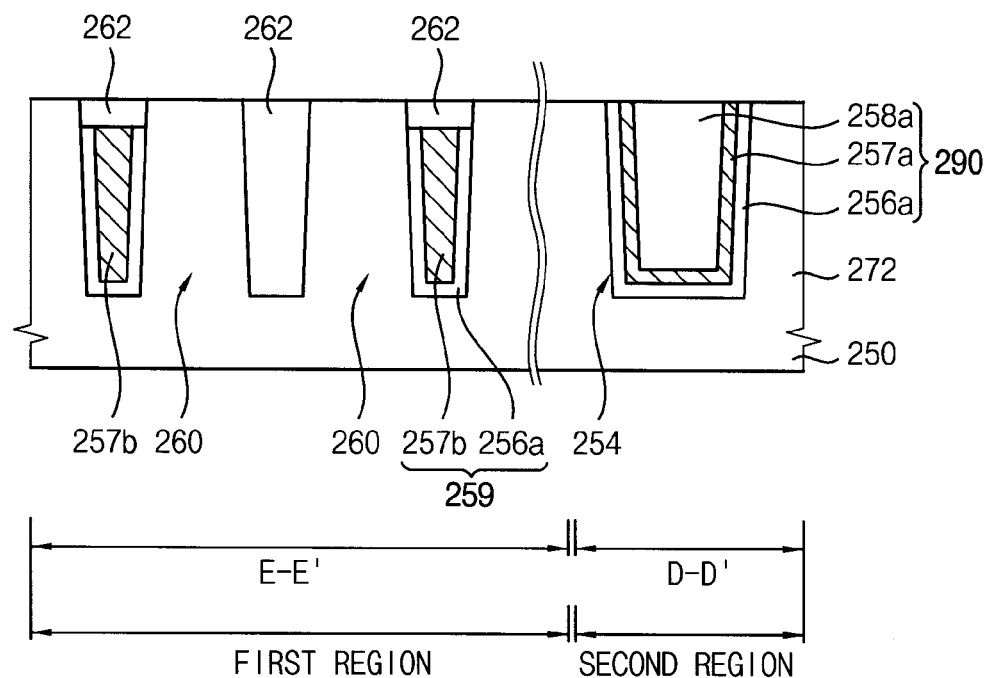

FIGS. 17A to 17C are cross-sectional views illustrating a method of manufacturing the pattern of the semiconductor device in FIG. 16. Particularly, FIGS. 17A to 17C are cross-sectional views cut along lines E-E' and D-D' of FIG. 16.

Referring to FIG. 17A, a first mask (not shown) may be formed on a substrate 250 including a first region and a second region.

The substrate 250 may be partially etched using the first mask as an etching mask to form a plurality of first trenches 252 in the first region and a second trench 254 in the second region. The second trench 254 may have a width wider than those of the first trenches 252. The etching process may include an anisotropic etch process.

After removing the first mask, a polysilicon layer (not shown) may be formed on inner walls of the first and second trenches 252 and 254, however, the process for forming the polysilicon layer may be skipped. A first silicon oxide layer 256 may be formed on the polysilicon layer. A silicon nitride layer may be formed on the first silicon oxide layer 256. The silicon nitride layer may completely fill remaining portions of the first trenches 252, whereas the silicon nitride layer may not completely fill the second trench 254. A second silicon oxide layer may be formed on the silicon nitride layer to completely fill remaining portions of the second trench 254. In the second region, a portion of the substrate 250 on which no second trench 254 is formed may serve as a second active pattern 272.

Upper portions of the second oxide layer and the silicon nitride layer may be planarized to form a second oxide layer pattern 258a and a first silicon nitride layer pattern 257a, respectively. In example embodiments, the second oxide layer pattern 258a may be formed in the second trench 254 in the second region, and the first silicon nitride layer pattern 257a may be formed in each first trench 252 in the first region and in the second trench 254 in the second region. Thus, a plurality of first silicon nitride layer patterns 257a may be formed in the first region.

Referring to FIG. 17B, a second mask 280 may be formed on the first silicon oxide layer 256, the first silicon nitride layer patterns 257a and the second silicon oxide layer pattern 258a. The second mask 280 may completely cover the second region and desired portions of the first region.

In the first region, the second mask 280 may have a plurality of lines each of which extends in the first direction and cover central top surfaces of the first silicon nitride layer patterns 257a. The second mask 280 may be formed by a double patterning process or a quadruple patterning process.

The first silicon nitride layer patterns 257a and the first silicon oxide layer 256 that are not covered by the second mask 280 in the first region and portions of the substrate 250 under the second mask 280 may be sequentially etched using the second mask 280 as an etch mask to form a plurality of third trenches 266. Thus, a plurality of second silicon nitride layer patterns 257b and a plurality of first silicon oxide layer patterns 256a may be formed in the first region. Additionally, a plurality of first active patterns 260 may be formed in the first region.

Referring to FIG. 17C, after removing the second mask 280, a second isolation layer filling the third trenches 266 may be formed.

An upper portion of the second isolation layer may be planarized until a top surface of the substrate 250 may be exposed to form a plurality of second isolation layer patterns 262.

In the planarization process, an upper portion of the first silicon oxide layer 256 in the first region may also be removed. Further, upper portions of the second silicon oxide layer pattern 258a, the first silicon nitride layer pattern 257a and the first silicon oxide layer 256 in the second region may be also planarized. Thus, the first silicon oxide layer 256 may be converted into the first silicon oxide layer pattern 256a in the second region.

The first silicon oxide layer pattern 256a and the second silicon nitride layer pattern 257b in the first region may be referred to as a first isolation layer pattern structure 259, and the first silicon oxide layer pattern 256a, the first silicon nitride layer pattern 257a and the second oxide layer pattern 258a in the second region may be referred to as a third isolation layer patternstructure 290.

Elements of a DRAM device (not shown) may be further formed on the pattern. The semiconductor device including the pattern may have a high reliability and/or a higher degree of integration.

Figure 18:
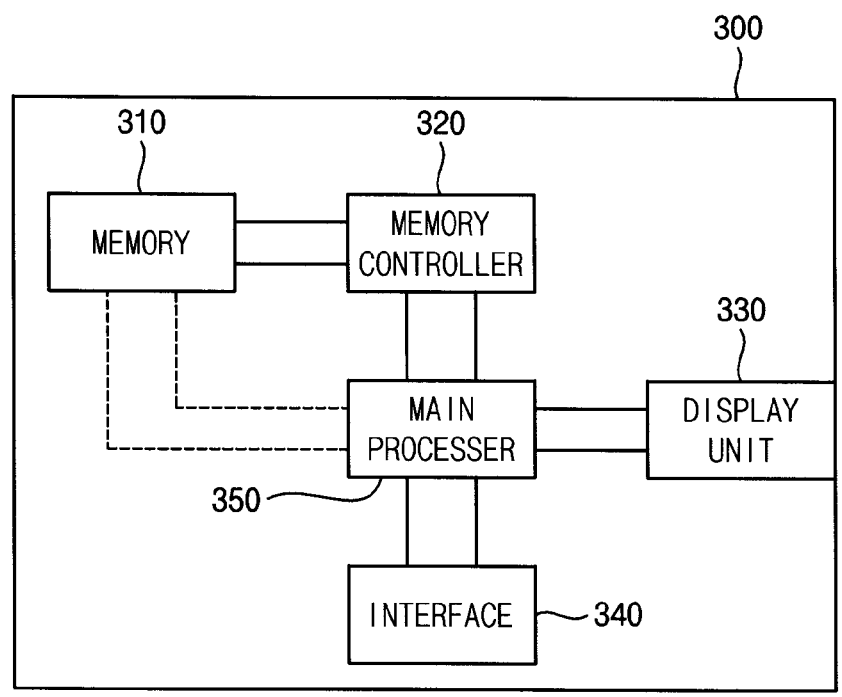
FIG. 18 is a block diagram of a system including a semiconductor device having patterns in accordance with an example embodiment.

FIG. 18 is a block diagram illustrating a system including a semiconductor device having patterns in accordance with an example embodiment.

Referring to FIG. 18, a system 300 may include a memory 310, a memory controller 320 for controlling an operation of the memory 310, a display unit 330 for outputting information, an interface 340 for receiving information, and a main processor 350 for controlling the above elements. The memory 310 may be a semiconductor device including patterns in accordance with example embodiments. The memory 310 may be connected to the main process 350 directly or via a BUS. The system 300 may be applied to personal computers, laptop computers, personal digital handsets, tablets, mobile phones, digital music players, etc.

According to example embodiments of the present inventive concepts, a semiconductor device may have a plurality of active patterns which may not collapse or incline. The present inventive concepts may be applied to forming a various type of semiconductor devices.

Although a few example embodiments have been described, those skilled in the art will readily appreciate that many modifications are possible in the example embodiments without materially departing from the novel teachings and advantages of the present inventive concepts. In the claims, means-plus-function clauses are intended to cover the structures described herein as performing the recited function, and are intended to cover not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A semiconductor device, comprising:
a plurality of active patterns arranged both in a first direction and in a second direction, the active patterns protruding from a substrate and having a length in the first direction;

a plurality of first isolation layer patterns filling first spaces, the first spaces between the active patterns and arranged in the first direction, the first isolation layer patterns supporting two opposing sidewalls of neighboring active patterns in the first direction, the first isolation layer patterns having top surfaces substantially coplanar with top surfaces of the active patterns; and a plurality of second isolation layer patterns filling second spaces between the active patterns and the first isolation layer patterns.

2. The semiconductor device of claim 1, wherein the first and second isolation layer patterns have an interface therebetween.

3. The semiconductor device of claim 1, wherein each of the first isolation layer patterns extends from corresponding one of the first spaces in a third direction, the third direction being perpendicular to the second direction.

4. The semiconductor device of claim 1, wherein a lower portion of each first isolation layer pattern is wider than an upper portion thereof.

5. The semiconductor device of claim 1, wherein the first isolation layer patterns each have an island-type shape.

6. The semiconductor device of claim 1, wherein the first isolation layer patterns are in direct contact with the active patterns.

7. The semiconductor device of claim 1, wherein each of the first isolation layer patterns has a linear shape extending in a third direction, the third direction being perpendicular to the second direction.

8. The semiconductor device of claim 7, wherein each of the first isolation layer patterns has a plurality of bumps in a fourth direction, the fourth direction being perpendicular to the first direction.

9. The semiconductor device of claim 1, wherein the first and second isolation layer patterns include an insulating material.

10. The semiconductor device of claim 1, further comprising:
a plurality of second active patterns, each of the second active patterns being wider than each of the first active patterns, the second active patterns protruding from the substrate; and
a plurality of third isolation layer patterns filling third spaces between the second active patterns.

11. The semiconductor device of claim 10, wherein the third isolation layer patterns include an insulating material substantially the same as that of the first isolation layer patterns.

12. A method of forming patterns of a semiconductor device, comprising:
partially etching a substrate to form a plurality of trenches thereon;
forming a plurality of preliminary first isolation layer patterns in the trenches;
partially etching the substrate and the preliminary first isolation layer patterns to form a plurality of active patterns and a plurality of first isolation layer patterns, respectively, such that the first isolation layer patterns have top surfaces substantially coplanar with top surfaces of the active patterns, the active patterns arranged both in a first direction and in a second direction and having a length in the first direction, and the first isolation layer patterns formed between the active patterns in the first direction and supporting the active patterns; and
forming a plurality of second isolation layer patterns filling spaces between the active patterns and the first isolation layer patterns.

13. The method of claim 12, wherein each of the first isolation layer patterns is formed to extend in a third direction.

14. The method of claim 12, wherein the first isolation layer patterns each are formed to have an island-type shape.

15. The method of claim 12, wherein forming the active patterns and the first isolation layer patterns includes:
forming an etch mask having a plurality of lines extending in the first direction and covering at least a portion of the preliminary first isolation layer patterns; and
etching the substrate using the etch mask.

16. A semiconductor device, comprising:
a plurality of active patterns protruding from a substrate, each of the active patterns extending along a first direction;
a plurality of first isolation layer patterns filling first spaces, the first spaces between respective neighboring active patterns and in a second direction, the first isolation layer patterns supporting two opposing sidewalls of the respective neighboring active patterns, the first isolation layer patterns having top surfaces substantially coplanar with top surfaces of the active patterns; and
a plurality of second isolation layer patterns filling second spaces and third spaces, the second spaces between the active patterns and in the second direction, the third spaces defined by upper and lower portions of the first isolation layer patterns.

17. The semiconductor device of claim 16, wherein each of the second isolation layer patterns extends along the first direction.

18. The semiconductor device of claim 16, wherein each of the first isolation layer patterns extends along the second direction.

19. The semiconductor device of claim 16, wherein the first and second directions are perpendicular to each other.

20. The semiconductor device of claim 16, wherein a lower portion of each of the first isolation layer patterns is wider than an upper portion thereof.

* * * * *